United States Patent
Toriyama

(10) Patent No.: US 7,720,215 B2
(45) Date of Patent: May 18, 2010

(54) SPEECH OUTPUT CONTROL DEVICE AND RECORDING MEDIUM RECORDED WITH SPEECH OUTPUT CONTROL PROGRAMS

(75) Inventor: Koji Toriyama, Nishitama-gun (JP)

(73) Assignee: Casio Computer Co., Ltd., Tokyo (JP)

( * ) Notice: Subject to any disclaimer, the term of this patent is extended or adjusted under 35 U.S.C. 154(b) by 1058 days.

(21) Appl. No.: 11/410,759

(22) Filed: Apr. 25, 2006

(65) Prior Publication Data

US 2006/0247920 A1     Nov. 2, 2006

(30) Foreign Application Priority Data

Apr. 28, 2005    (JP)   ............... 2005-133572

(51) Int. Cl.
     *H04M 1/00*     (2006.01)
(52) U.S. Cl. ............... 379/406.08; 379/399.01
(58) Field of Classification Search ............ 700/94; 381/56, 57, 58, 312, 323, 104, 106, 107, 381/120; 455/343.2, 572, 574, 575
See application file for complete search history.

(56) References Cited

U.S. PATENT DOCUMENTS

| | | | |
|---|---|---|---|
| 4,489,396 A | 12/1984 | Hashimoto et al. | |
| 5,515,432 A | 5/1996 | Rasmusson | |
| 5,651,056 A * | 7/1997 | Eting et al. | 379/88.01 |
| 7,110,559 B2 * | 9/2006 | Behboodian et al. | 381/106 |
| 7,120,803 B2 | 10/2006 | Tanaka | |
| 7,451,330 B2 | 11/2008 | Tanaka | |

| | | | |
|---|---|---|---|
| 2003/0160702 A1 | 8/2003 | Tanaka | |
| 2004/0138769 A1 | 7/2004 | Akiho | |

FOREIGN PATENT DOCUMENTS

| | | |
|---|---|---|
| JP | 4-365210 A | 12/1992 |
| JP | 2000-101375 A | 4/2000 |
| JP | 2002-151974 A | 5/2002 |
| JP | 2004-152648 | 5/2004 |
| TW | 504913 B | 10/2002 |

OTHER PUBLICATIONS

Taiwanese Office Action dated Aug. 4, 2009 (6 pages), and English translation thereof (9 pages), issued in counterpart Taiwanese Application Serial No. 095115010.

* cited by examiner

*Primary Examiner*—Walter F Briney, III
(74) *Attorney, Agent, or Firm*—Frishauf, Holtz, Goodman & Chick, P.C.

(57) ABSTRACT

While the amplification factor of an external amplifier is increased to raise the minimum volume level, synthesized speech of text data is generated as PCM data. When the PCM data is output for each frame (63 ms), the voltage of a battery power supply is detected and different ATT values (attenuation ratios) are set in accordance with threshold values (Level 1~4) corresponding to the detected voltage. The lower the power supply voltage, the larger the attenuation ratios. The PCM data is attenuated by such an attenuation ratio to reduce a load to the battery power supply. Even though the battery power supply is exhausted to some extent, no power-down due to an instantaneous increase in power load occurs, with the result that a high-level part of a series of speech data items is output at an adequate volume level that makes a low-level part thereof easy to hear.

4 Claims, 21 Drawing Sheets

| NO. | THRESHOLD VALUE | ATTENUATION VALUE (ATTENUATION RATIO) |
|---|---|---|
| 1 | PCM1 | ATT1 (-1dB) |
| 2 | PCM2 | ATT2 : |
| 3 | PCM3 | ATT3 : |
| 4 | PCM4 | ATT4 : |
| 5 | PCM5 | ATT5 (-3dB) |
| 6 | PCM6 | ATT6 : |
| 7 | PCM7 | ATT7 : |
| 8 | PCM8 | ATT8 (-4dB) |
| 9 | PCM9 | ATT9 : |
| 10 | PCM10 | ATT10 (-6dB) |

[PREVIOUS PCM PEAK≦PRESENT PCM PEAK] 12b31:
ATT SETTING TABLE FOR INCREASE IN INPUT

| NO. | THRESHOLD VALUE | ATTENUATION VALUE (ATTENUATION RATIO) |
|---|---|---|
| 1 | PCM1 | ATT1 (-1dB) |
| 2 | PCM2 | ATT2 : |
| 3 | PCM3 | ATT3 : |
| 4 | PCM4 | ATT4 : |
| 5 | PCM5 | ATT5 (-3dB) |
| 6 | PCM6 | ATT6 : |
| 7 | PCM7 | ATT7 : |
| 8 | PCM8 | ATT8 (-4dB) |
| 9 | PCM9 | ATT9 : |
| 10 | PCM10 | ATT10 (-6dB) |

FIG.10A

[PREVIOUS PCM PEAK>PRESENT PCM PEAK] 12b32:
ATT SETTING TABLE FOR DECREASE IN INPUT

| NO. | THRESHOLD VALUE | ATTENUATION VALUE (ATTENUATION RATIO) |
|---|---|---|
| 1 | PCM1'=PCM1-ΔP1 | ATT1 (-1dB) |
| 2 | PCM2'=PCM2-ΔP2 | ATT2 : |
| 3 | PCM3'=PCM3-ΔP3 | ATT3 : |
| 4 | PCM4'=PCM4-ΔP4 | ATT4 : |
| 5 | PCM5'=PCM5-ΔP5 | ATT5 (-3dB) |
| 6 | PCM6'=PCM6-ΔP6 | ATT6 : |
| 7 | PCM7'=PCM7-ΔP7 | ATT7 : |
| 8 | PCM8'=PCM8-ΔP8 | ATT8 (-4dB) |
| 9 | PCM9'=PCM9-ΔP9 | ATT9 : |
| 10 | PCM10'=PCM10-ΔP10 | ATT10 (-6dB) |

FIG.10B

ATTENUATION OF
((n-1)-TH FRAME-50)

ATTENUATION OF
(n-TH FRAME-120)

| PCM1-51 |
| PCM2-52 |
| PCM3-53 |
| ⋮ |
| PCM69-119 |
| PCM70-120 |
| ⋮ |
| PCMn-120 |

ATTENUATION OF
((n+1)-TH FRAME-70)

| PCM1-119 |
| PCM2-118 |
| PCM3-117 |
| ⋮ |
| PCM49-71 |
| PCM50-70 |
| ⋮ |
| PCMn-70 |

FIG. 18A

[PREVIOUS VOLTAGE LEVEL > PRESENT VOLTAGE LEVEL] 12b33:
ATT SETTING TABLE FOR DECREASE IN VOLTAGE

| NO. | POWER SUPPLY VOLTAGE LEVEL | ATTENUATION VALUE (ATTENUATION RATIO) |
|---|---|---|
| 1 | Level1 | ATT1 (-1dB) |
| 2 | Level2 | ATT2 (-2dB) |
| 3 | Level3 | ATT3 (-4dB) |
| 4 | Level4 | ATT4 (-6dB) |

FIG. 18B

[PREVIOUS VOLTAGE LEVEL ≦ PRESENT VOLTAGE LEVEL] 12b34:
ATT SETTING TABLE FOR INCREASE IN VOLTAGE

| NO. | POWER SUPPLY VOLTAGE LEVEL | ATTENUATION VALUE (ATTENUATION RATIO) |
|---|---|---|
| 1 | Level1'=Level1+$\Delta V_1$ | ATT1 (-1dB) |
| 2 | Level2'=Level2+$\Delta V_2$ | ATT2 (-2dB) |
| 3 | Level3'=Level3+$\Delta V_3$ | ATT3 (-4dB) |
| 4 | Level4'=Level4+$\Delta V_4$ | ATT4 (-6dB) |

FIG. 19

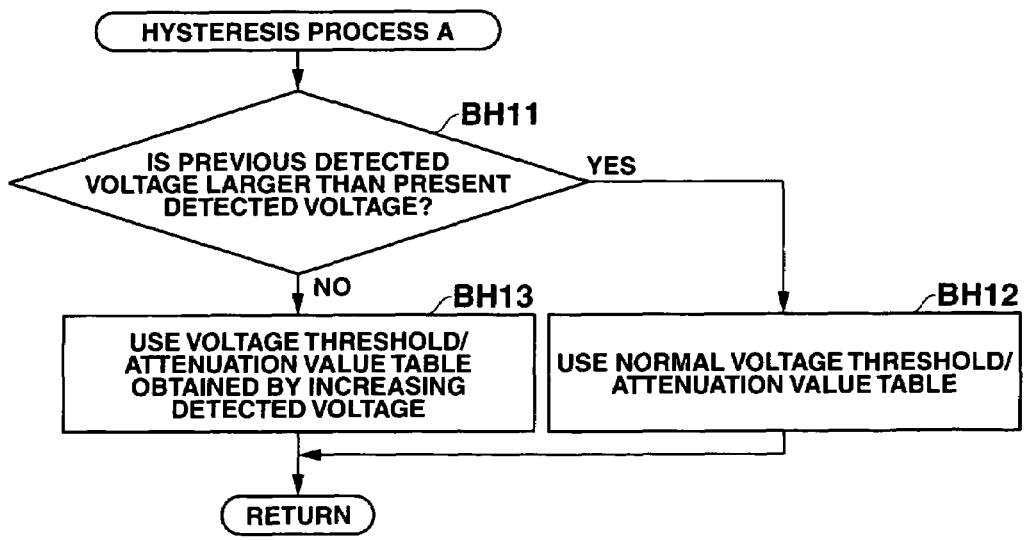

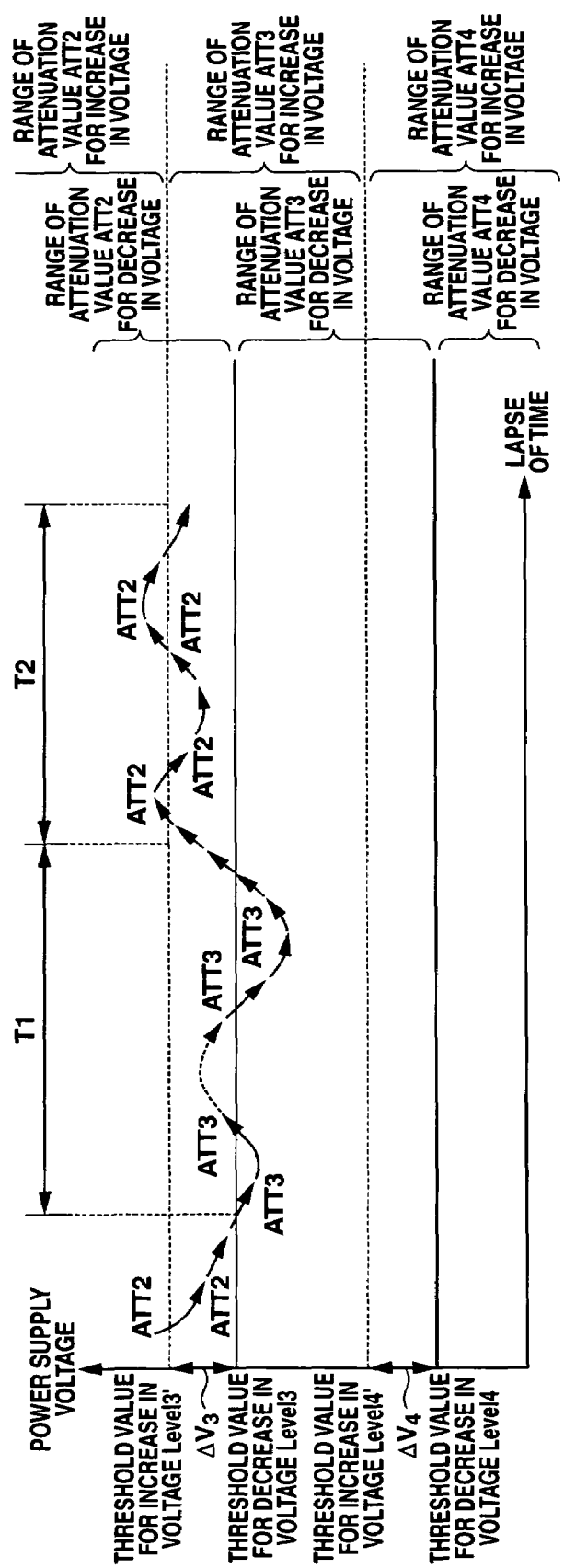

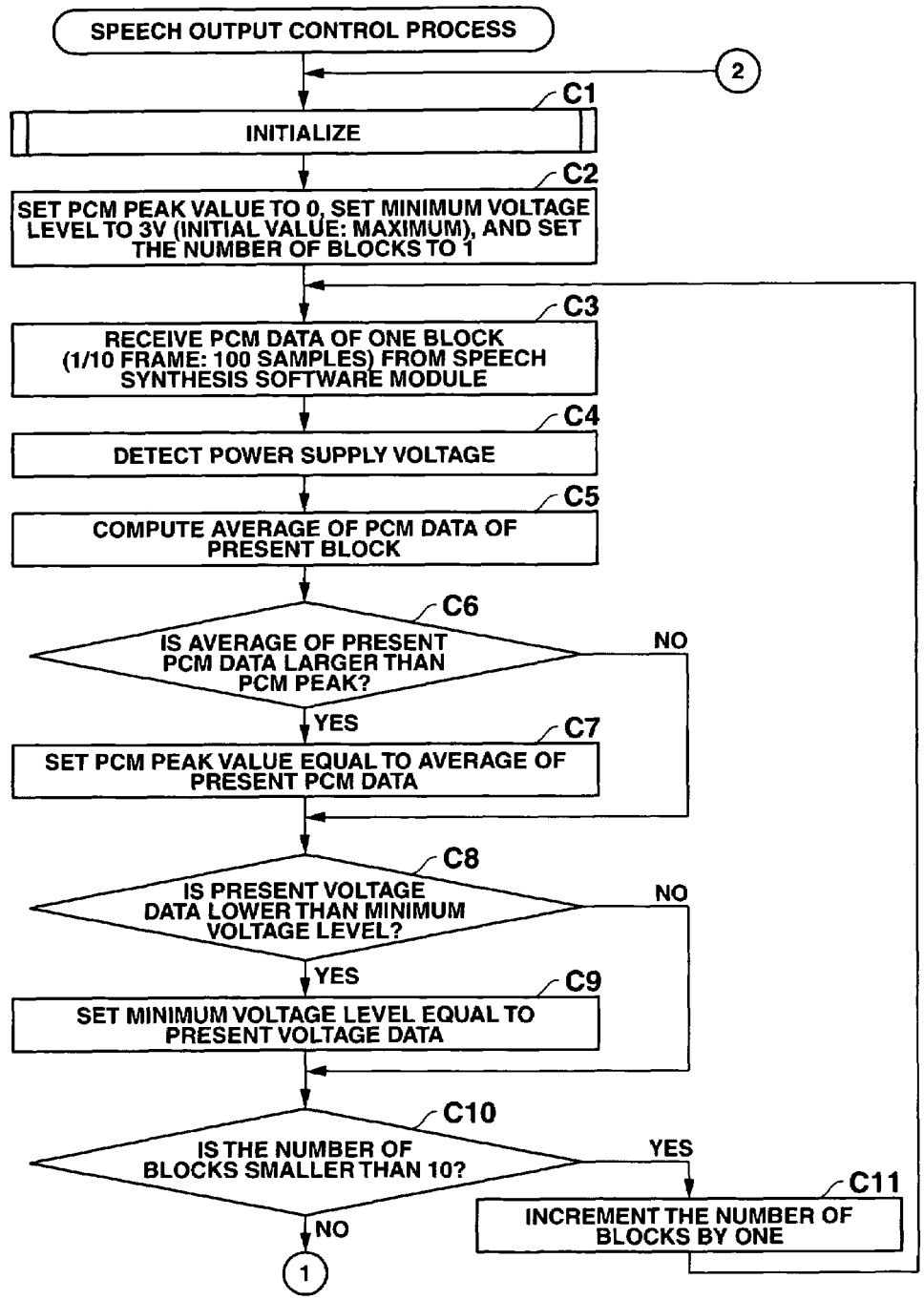

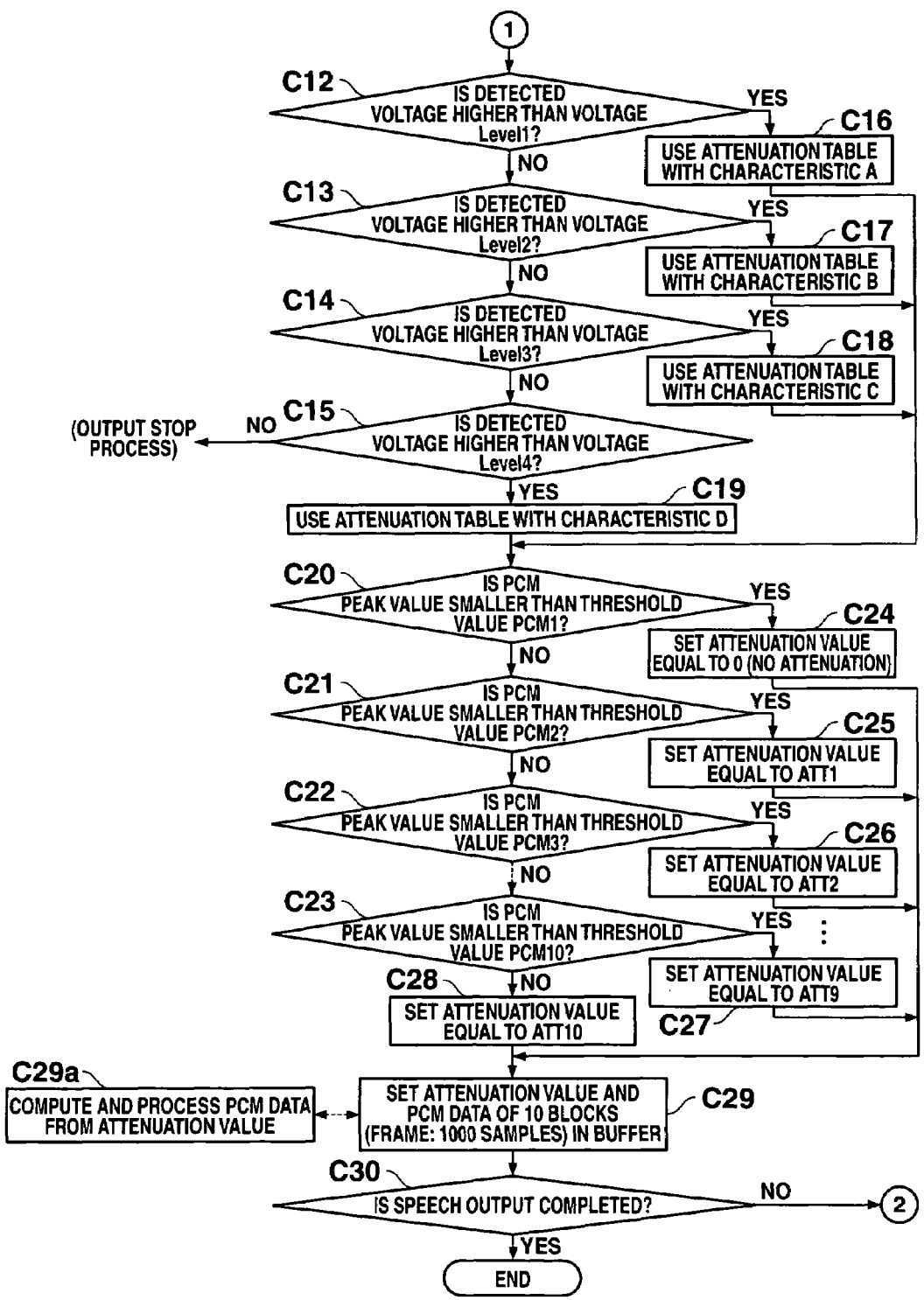

SPEECH OUTPUT CONTROL DEVICE AND RECORDING MEDIUM RECORDED WITH SPEECH OUTPUT CONTROL PROGRAMS

CROSS-REFERENCE TO RELATED APPLICATIONS

This application is based upon and claims the benefit of priority from prior Japanese Patent Application No. 2005-133572, filed Apr. 28, 2005, the entire contents of which are incorporated herein by reference.

BACKGROUND OF THE INVENTION

1. Field of the Invention

The present invention relates to a speech output control device for use in electronic apparatuses having a speech output function and driven by a battery, and a recording medium recorded with speech output control programs.

2. Description of the Related Art

Conventionally, electronic apparatuses having a speech output function, such as audio equipment, include an output volume control device that optimizes the volume and tone of output speech in accordance with various use environments of the electronic apparatuses.

For example, vehicle-mounted audio equipment includes an output volume control device. The output volume control device varies the volume and tone of output speech in accordance with its surrounding noise level. When the noise level rises to distort the output speech, the output volume control device controls the volume such that an audience can easily listen to the output speech.

The speech output device of a personal computer includes an output volume control device. The output volume control device controls the output volume and sets it at a fixed level each time the speech output device receives speech signals of different recording levels. When the device outputs a different speech signal at the same volume level as that of the last speech signal, it controls the volume of the output speech signal and prevents it from being distorted.

The above prior art output volume control devices compress an input speech signal over a dynamic range in order to prevent an output speech from being distorted in consideration of an external influence such as a surrounding noise level and an output gain of volume.

There is a small-sized electronic device, such as an electronic dictionary with a speech output function, which outputs reading speech of text such as words and examples. The dynamic range of the output reading speech is greatly widened in accordance with the rhythm, stress, and intonation of reading.

Such a small-sized electronic device is driven by a battery. It is thus necessary to control the volume of text speech and restrict its maximum output volume in order to prevent the maximum part of text speech from being powered down due to a temporary voltage drop even though the battery is almost dead. If, however, the maximum output volume is restricted, a user can hardly listen to or cannot listen to a low-level part of the text speech.

When text speech data of recorded real speech is output, a low-level part of the recorded speech can be raised to an audible level in advance. However, when not recorded speech but reading text speech is synthesized and the synthesized speech is output in real time, the volume level cannot be controlled (changed) in advance.

BRIEF SUMMARY OF THE INVENTION

According to an aspect of the present invention, there is provided a speech output control device which controls output of a series of speech data items, comprising speech output means for outputting speech, power supply means for supplying a power supply voltage to output the speech from the speech output means, speech data acquisition means for acquiring speech data of one output unit from the series of speech data items, voltage detection means for detecting the power supply voltage supplied from the power supply means when the speech data of one output unit acquired by the speech data acquisition means is output, volume level adjustment means for adjusting a volume level of the speech data of one output unit acquired by the speech data acquisition means, in accordance with the power supply voltage detected by the voltage detection means, and speech output control means for causing the speech output means to output the speech data whose volume level is adjusted by the volume level adjustment means.

In the speech output control device, the volume level adjustment means includes attenuation value setting means for setting a volume attenuation value which increases with decrease in the power supply voltage detected by the voltage detection means, and the volume level adjustment means attenuates and adjusts the volume level of the speech data of one output unit acquired by the speech data acquisition means, in accordance with the volume attenuation value set by the attenuation value setting means.

According to the present invention, even though the battery power supply is exhausted to some extent, a high-level part of a series of speech data items is output at an adequate volume level that makes a low-level part thereof easy to hear.

BRIEF DESCRIPTION OF THE SEVERAL VIEWS OF THE DRAWING

FIG. 8A is an illustration of a display operation of a searched information display screen, which is performed in accordance with the dictionary search speech output process of the portable device;

FIG. 8B is an illustration of another display operation of the searched information display screen, which is performed in accordance with the dictionary search speech output process of the portable device;

FIG. 8C is an illustration of still another display operation of the searched information display screen, which is performed in accordance with the dictionary search speech output process of the portable device;

FIG. 8D is an illustration of yet another display operation of the searched information display screen, which is performed in accordance with the dictionary search speech output process of the portable device;

FIG. 10A is a first ATT value setting table for setting an attenuation ratio (ATT value) corresponding to the peak value of PCM data to be output as speech by performing a hysteresis process A;

FIG. 10B is a second ATT value setting table for setting an attenuation ratio (ATT value) corresponding to the peak value of PCM data to be output as speech by performing the hysteresis process A;

FIG. 18A is a first power supply voltage level/ATT value setting table for setting an attenuation ratio (ATT value), which corresponds to the power supply voltage detected when PCM data is output as speech, by the hysteresis process A;

FIG. 18B is a second power supply voltage level/ATT value setting table for setting an attenuation ratio (ATT value), which corresponds to the power supply voltage detected when PCM data is output as speech, by the hysteresis process A;

FIG. 19 is a flowchart of the hysteresis process A to selectively use the first and second power supply voltage level/ATT value setting tables in accordance with the direction of variation in the detected power supply voltage;

FIG. 20 is a chart showing a variation in the ATT value set in the speech output control process accompanying the hysteresis process A;

FIG. 24 is a flowchart showing a first speech output control process of the speech output control device according to the third embodiment of the present invention; and FIG. 25 is a flowchart showing a second speech output control process of the speech output control device according to the third embodiment of the present invention.

DETAILED DESCRIPTION OF THE INVENTION

Embodiments of the present invention will be described with reference to the accompanying drawings.

First Embodiment

Figure 1:
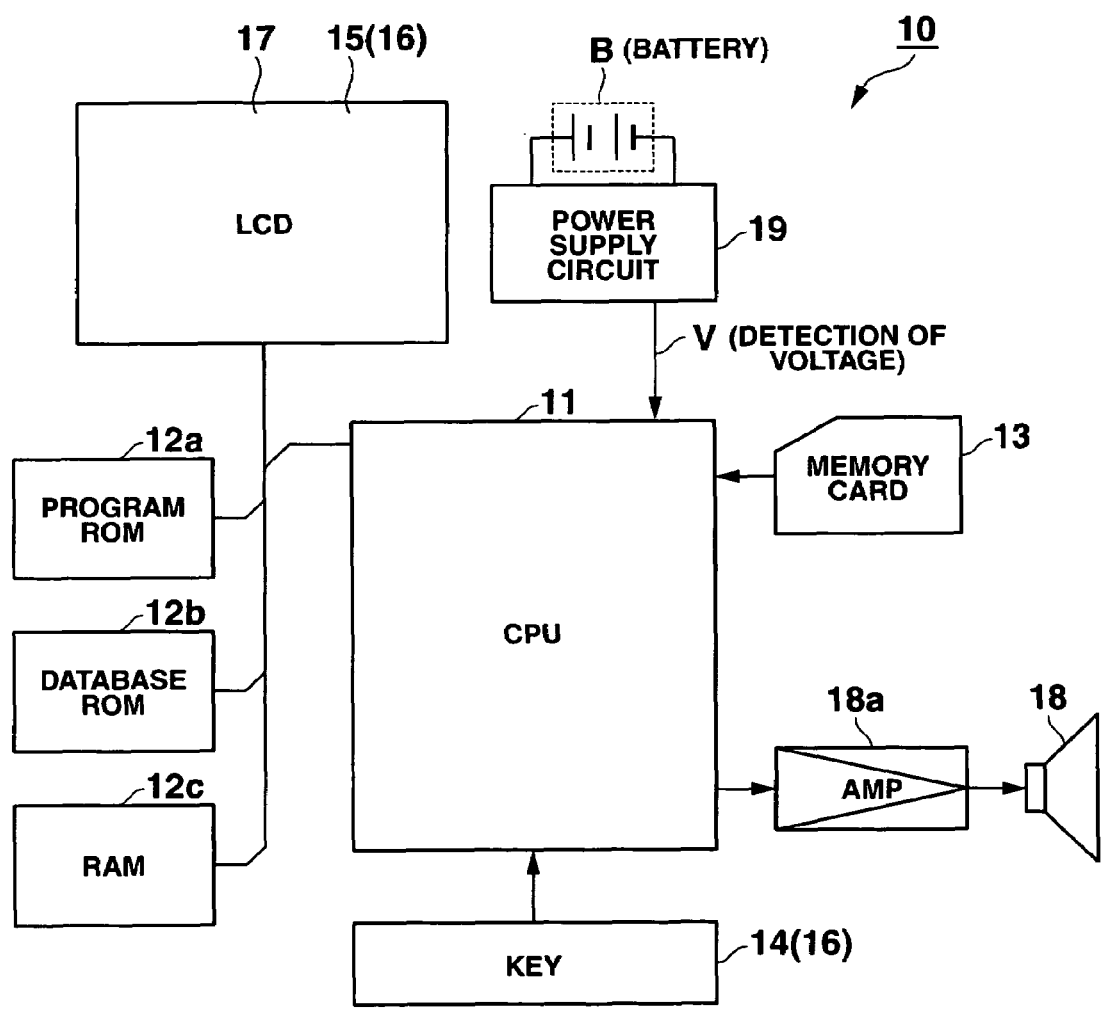
FIG. 1 is a block diagram showing a configuration of an electronic circuit of a portable device (electronic dictionary), which includes a speech output control device according to a first embodiment of the present invention.

FIG. 1 is a block diagram showing a configuration of an electronic circuit of a portable device (electronic dictionary) 10 which includes a speech output control device according to a first embodiment of the present invention.

The portable device 10 is configured as a personal digital assistant (PDA), a personal computer (PC), a cellular phone and an electronic book, each having an electronic dictionary function, or as one used exclusively for an electronic dictionary (described later). The portable device 10 includes a computer which receives programs from various storage mediums and operates according to the received programs. The computer includes an electronic circuit with a central processing unit (CPU) 11.

The CPU 11 controls the operations of respective units of the circuit in accordance with device control programs stored in advance in a program ROM 12a, device control programs loaded into the program ROM 12a from an external memory medium such as a memory card 13, or device control programs loaded into the program ROM 12a from a Web server (program server) on the Internet N (not shown) through a communications device. The device control programs stored in the program ROM 12a are started in response to a user's input signal from an input unit 16 such as a keyboard 14 and a touch panel 15 or a communications signal for connection with a memory card (memory medium) 13 such as an externally-connected EEPROM, RAM and ROM.

A database ROM 12b and a RAM 12c as well as the program ROM 12a are connected to the CPU 11. Further, the memory card 13, keyboard 14 and touch panel 15 is connected to the CPU 11 and so is a display unit 17 of an LCD. A speaker 18 is also connected thereto via a speech output amplifier 18a.

The electronic circuit of the portable device 10 is driven by the voltage applied from a power supply circuit 19 operated by a battery power supply B.

Figure 2:
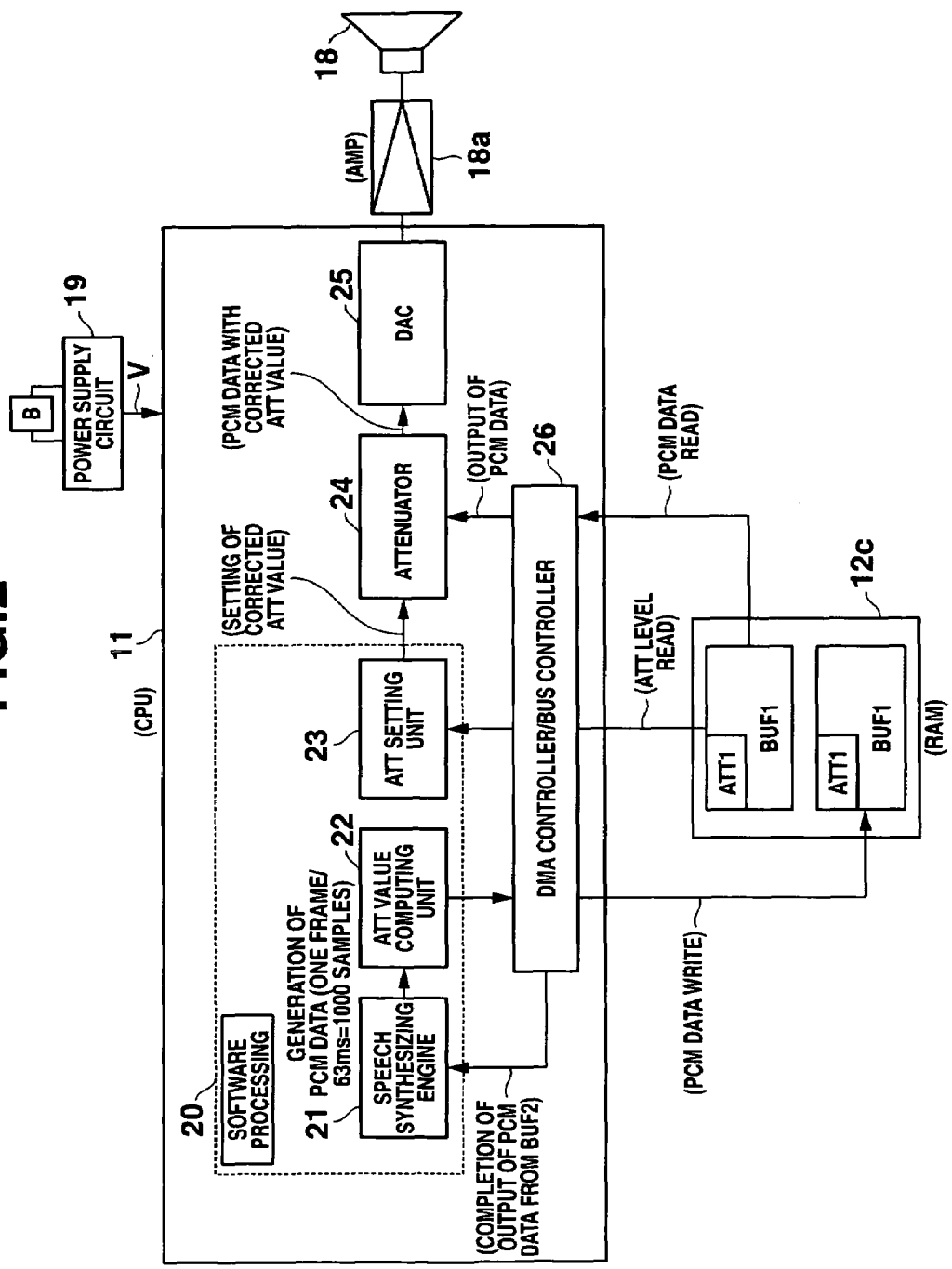
FIG. 2 is a block diagram showing a configuration of the main body of the speech output control device included in the electronic circuit of the portable device.

FIG. 2 is a block diagram showing a configuration of the main body of the speech output control device included in the electronic circuit of the portable device 10.

As the main body of the speech output control device, the CPU 11 includes a speech synthesizing engine 21, an attenuation (ATT) value computing unit 22, and a software processing unit 20 having an ATT setting unit 23.

The speech synthesizing engine 21 generates a synthesized speech signal corresponding to text data such as words and examples, which is to be output as speech, and also generates pulse code modulation (PCM) data of the synthesized speech signal.

The ATT value computing unit 22 extracts one thousand samples from the PCM data for each frame (63 ms) and computes an average of every one hundred samples (6.3 ms) of the one thousand samples. Then, the unit 22 obtains the maximum average as a PCM peak value in one frame and computes an attenuation ratio (ATT value), which inhibits the speech output level of PCM data in the one frame from exceeding the limit of power-down, in accordance with the PCM peak value (see FIGS. 4A to 6C).

The ATT setting unit 23 sets the attenuation ratio (ATT value) in a digital attenuator 24 to read the PCM data in the one frame from a RAM 12c and output it as speech through the digital attenuator 24 and a digital/analog converter (DAC) 25.

The RAM 12c includes two buffers BUF1 and BUF2 that alternately and temporarily store PCM data extracted for each frame by the ATT value computing unit 22 and an ATT value of the PCM data. The CPU 11 includes a DMA controller/ BUS controller 26. The DMA controller/BUS controller 26 performs an operation (PCM Data Write) of writing PCM data to a BUF1/BUF2 from the ATT value computing unit 22, an operation (PCM Data Read) of reading PCM data out of the BUF1/BUF2, an operation of outputting the PCM data to the digital attenuator 24, an operation (ATT level Read) of reading an ATT value out of the BUF1/BUF2, an operation of outputting the ATT value to the ATT setting unit 23, and an operation of notifying the speech synthesizing engine 21 of the completion of output of PCM data from the BUF1/BUF2.

More specifically, the DMA controller/BUS controller 26 performs the following control operations:

(1) The controller 26 writes, to the BUF1, PCM data for one frame (1000 samples), which is created by the speech synthesizing engine 21 and extracted by the ATT value computing unit 22.

(2) The controller 26 writes, to the BUF2, PCM data for the next one frame (1000 samples), which is also created by the speech synthesizing engine 21 and extracted by the ATT value computing unit 22.

(3) The controller 26 reads the ATT value from the BUF1 into the ATT setting unit 23 and then sets it in the attenuator 24.

(4) When PCM data for two frames is written to the BUF1/ BUF2, the controller 26 designates the BUF1 as a transfer buffer, and starts a DMA transfer of the PCM data to the attenuator 24 to output a text speech signal.

(5) When the DMA transfer of PCM data from the BUF1 is completed, the controller 26 reads the ATT value from the BUF2 into the ATT setting unit 23 and then sets it in the attenuator 24.

(6) The controller 26 designates the BUF2 as a transfer buffer, and starts a DMA transfer of the PCM data to the attenuator 24 to output a text speech signal.

(7) The controller 26 notifies the speech synthesizing engine 21 of the completion of output of PCM data from the BUF2, and starts to create PCM data for the next frame.

After that, the above control operations are repeated until all text data to be output as speech is completely output.

Figure 3:
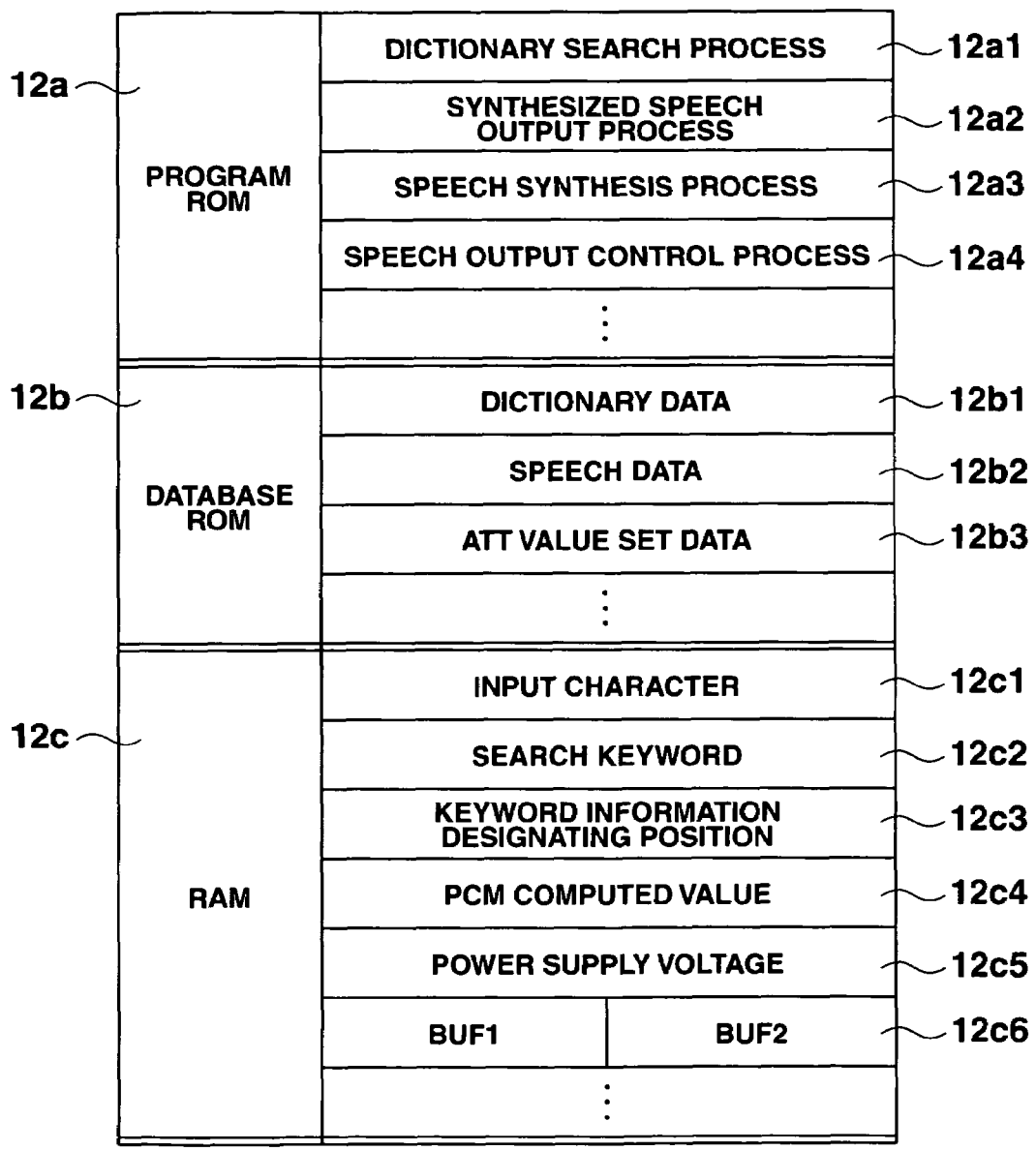
FIG. 3 is a chart of contents of data stored in a program ROM, a database ROM and a RAM of the portable device.
Figure 4:
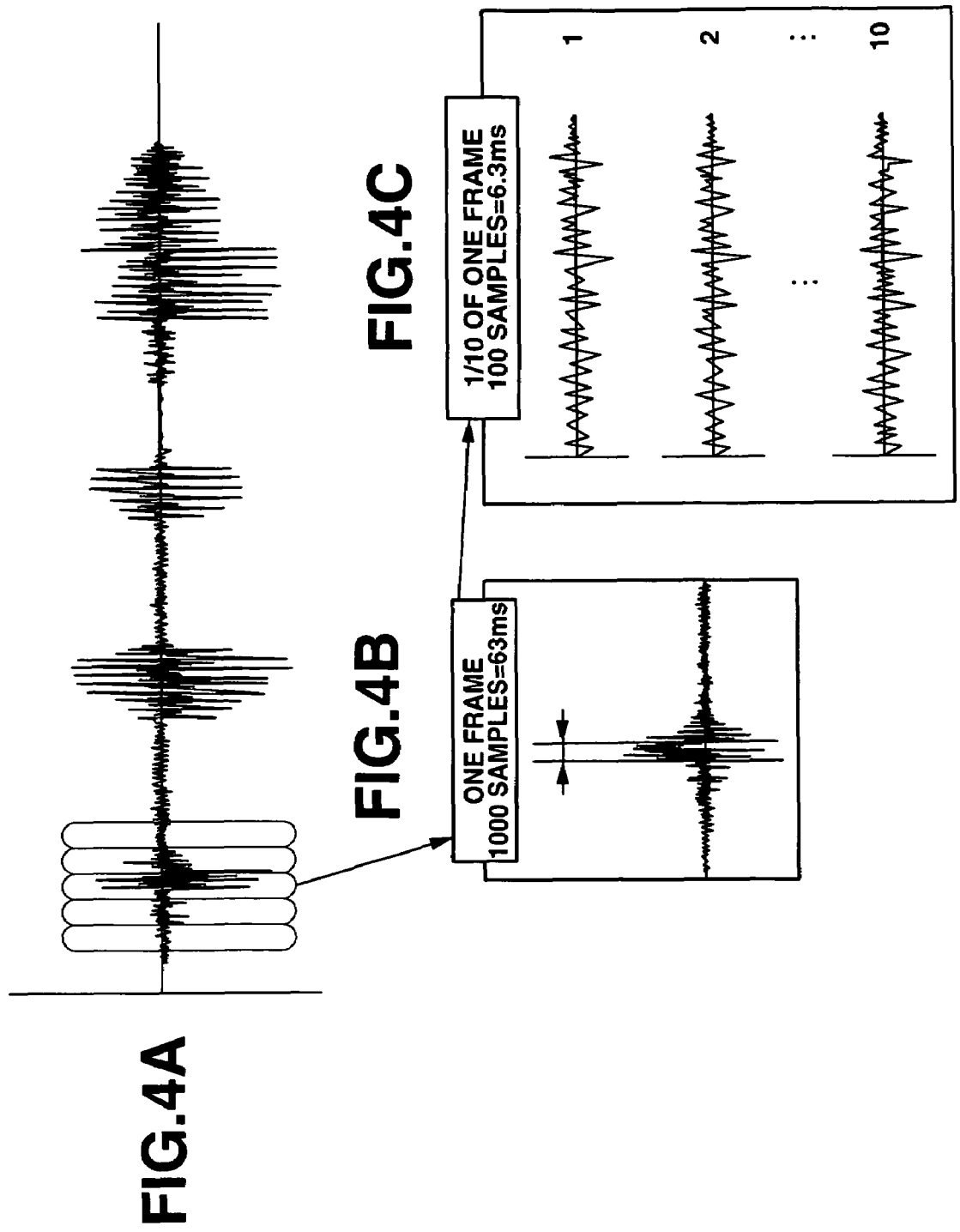
FIG. 4A is a waveform chart of a text speech signal to be output as speech to describe a procedure for extracting the signal when the peak of the signal is obtained for each frame.
FIG. 4B is a waveform chart of samples of the text speech signal in one frame.
FIG. 4C is an enlarged waveform chart of the text speech signal in each of ten parts of the one frame.

FIG. 3 is a chart of contents of data stored in the program ROM 12a, database ROM 12b and RAM 12c of the portable device 10.

As the device control programs stored in the program ROM 12a, there are a dictionary search program 12a1 for displaying a keyword searched from dictionary data 12b1 by inputting characters and its explanation information, a synthesized speech output program 12a2 for outputting text data, which is displayed, as reading speech, a speech synthesizing program 12a3 for synthesizing speech data (12b2) of phonemes in accordance with a combination of character strings of the text data and the phonetic symbols of the text data to generate PCM data of reading speech, a speech output control program 12a4 for computing an attenuation ratio (ATT value) to inhibit the speech output level of the PCM data from exceeding a power-down limit on the basis of the peak value of the PCM data and controlling the speech output of the PCM data, and the like.

The database ROM 12b stores dictionary data 12b1 of different dictionaries such as an English-Japanese dictionary, an English dictionary, a Japanese-English dictionary, a Japanese dictionary, and a dictionary of Chinese characters explained in Japanese, speech data 12b2 corresponding to the phonemes used in the speech synthesis processing, and ATT value setting data 12b3 (FIG. 5) for setting an attenuation ratio (ATT value) corresponding to the peak value of PCM data to be output as speech.

Like the dictionary data 12b1 stored in the database ROM 12b, the other dictionary data stored in the memory card 13 is externally received and accessible.

The RAM 12c includes an input character memory 12c1 for storing character data input from the input unit 16 (14, 15), a searched keyword memory 12c2 for storing the keyword searched by the dictionary search (12a1) and its explanation information, a keyword information designating position memory 12c3 for storing position data of words and examples designated by a user in the searched and displayed keyword and explanation information, a PCM computed value memory 12c4 for storing a peak value of PCM data for each frame, which is computed by the ATT value computing unit 22 (FIG. 2) in accordance with the speech output control (12a4), a power supply voltage memory 12c5 for storing a detected voltage V of the power supply voltage supplied from the power supply circuit 19, and a buffer memory (BUF1/BUF2 shown in FIG. 2) 12c6 for storing PCM data to be output as speech for each frame.

As described above, the portable device (electronic dictionary) 10 performs the following speech output control. When a user designates text data such as words and sentences, which is to be output as reading speech, in a keyword and its explanation information displayed by dictionary search, the text data is speech-synthesized to generate PCM data and set an attenuation ratio (ATT value) corresponding to the peak value of the PCM data for each frame. The PCM data is output as speech to such an extent that its speech output level almost reaches the limit of power-down.

When the designated text data is output as reading speech, the peak value of PCM data of the synthesized text data is inhibited from exceeding the limit of power-down due to the speech output of the PCM data and accordingly the amplifier 18a is increased in amplification factor to raise the minimum volume level. Thus, both a low volume level part and a high volume level part of text speech data whose dynamic range is very large can be output at such an optimum volume level that the data is easy to hear.

The principle of speech output control in the speech output control device according to the first embodiment will be described.

FIGS. 4A to 4C are charts for describing a procedure for extracting a text speech signal to be output as speech when the peak value of the text speech signal is obtained for each frame. Of these figures, FIG. 4A is a waveform chart of a text speech signal to be output, FIG. 4B is a waveform chart of samples of the text speech signal for one frame, and FIG. 4C is an enlarged waveform chart of the text speech signal in each of ten parts of the one frame.

When a speech signal to be output as speech is provided as shown in FIG. 4A, one thousand samples are extracted from the signal for each frame of 63 ms as shown in FIG. 4B. One thousand samples of each frame are divided into ten parts each having one hundred samples (6.3 ms) as shown in FIG. 4C. The average of one hundred samples of each of the ten parts is obtained from the PCM data, and the maximum one of the averages of the ten parts is set as the peak value of the PCM data in each frame.

Figure 5:
FIG. 5 is an ATT value setting table for setting an attenuation ratio (ATT value) corresponding to the peak value of PCM data to be output as speech.

FIG. 5 is an ATT value setting table (12b3) for setting an attenuation ratio (ATT value) corresponding to the peak value of PCM data to be output as speech.

Figure 6A:
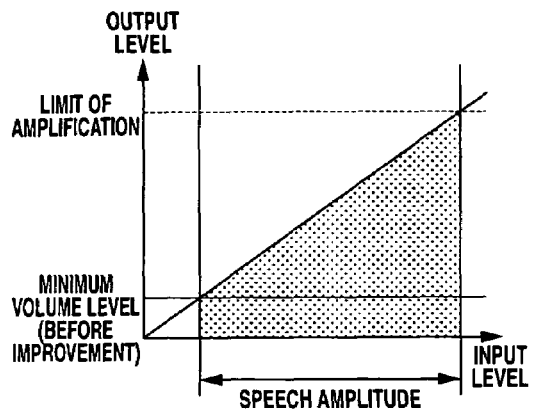
FIG. 6A is a chart of prior art input/output characteristics obtained when an input speech signal is simply linearly amplified and output within the limit of amplification in order to illustrate the functions and advantages of the speech output control device according to the first embodiment.
Figure 6B:
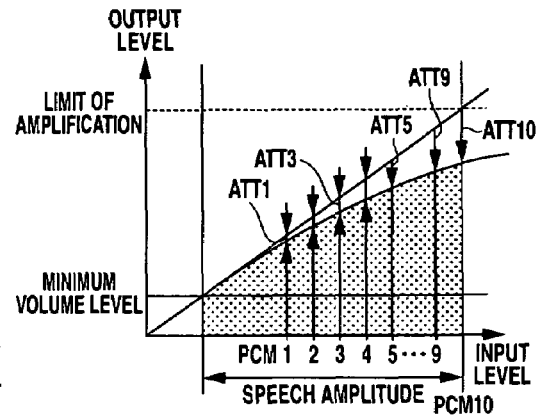
FIG. 6B is a chart of input/output characteristics obtained when an input speech signal is output by setting an attenuation ratio (ATT value) corresponding to the PCM peak value of the speech signal.
Figure 6C:
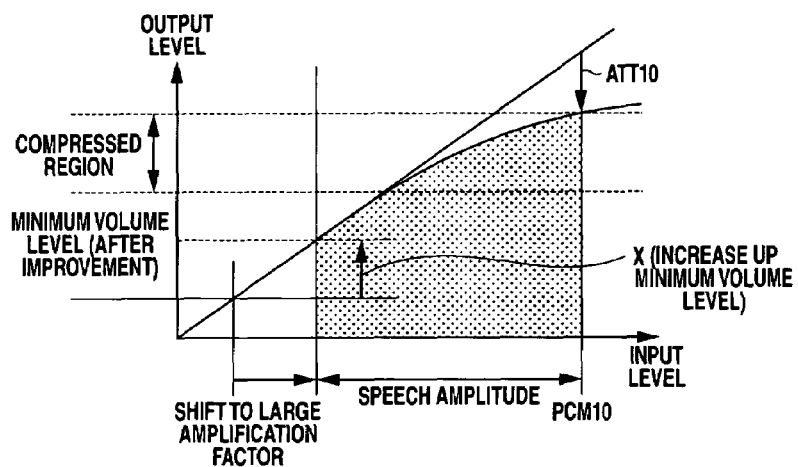
FIG. 6C is a chart of input/output characteristics obtained from the first embodiment in which the minimum volume level is raised by increasing the amplification factor to the limit of amplification by setting the attenuation ratio (ATT value) corresponding to the PCM peak value.
Figure 6D:
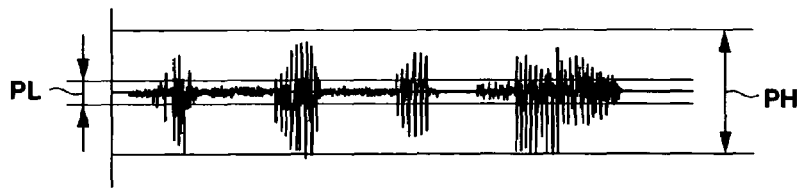
FIG. 6D is a chart of output signal waveforms of text speech data corresponding to the prior art input/output characteristics.
Figure 6E:
FIG. 6E is a chart of output signal waveforms of text speech data corresponding to the input/output characteristics of the first embodiment.

FIGS. 6A to 6E are charts illustrating the functions and advantages of the speech output control device according to the first embodiment. Of these figures, FIG. 6A is a chart of prior art input/output characteristics obtained when an input speech signal is simply linearly amplified and output within the limit of amplification, FIG. 6B is a chart of input/output characteristics obtained when an input speech signal is output by setting an attenuation ratio (ATT value) corresponding to the PCM peak value of the speech signal, FIG. 6C is a chart of input/output characteristics obtained from the first embodiment in which the minimum volume level is raised by increasing the amplification factor to the limit of amplification by setting the attenuation ratio (ATT value) corresponding to the PCM peak value, FIG. 6D is a chart of output signal waveforms of text speech data corresponding to the prior art input/output characteristics, and FIG. 6E is a chart of output signal waveforms of text speech data corresponding to the input/output characteristics of the first embodiment.

When a speech signal is output in accordance with the input/output characteristics of the prior art volume control apparatus as shown in FIG. 6A, it is amplified uniformly with linearity from its minimum input level to maximum input level. If, therefore, the maximum output level of the signal is set not to exceed the limit of amplification in order to avoid power-down due to an instantaneous increase in power load, the minimum output level is lower than the minimum input level, with the result that a speech part that is hard to hear will be caused especially in intoned output text reading speech.

If PCM data with a higher input level is attenuated by setting attenuation ratios (ATT values) ATT1 to ATT10 corresponding to PCM peak values PCM1 to PCM10 of an input speech signal, the attenuation generates a margin between the level of the PCM data and the limit of amplification. If the amplification factor of the amplifier 18a is increased by the margin as shown in FIG. 6C, the minimum output level can be raised up only by the increase in amplification factor as indicated by arrow X while the maximum output level does not exceed the limit of amplification.

Consequently, the maximum value PH of the output signal of text speech data corresponding to the prior art input/output characteristics shown in FIG. 6D and that of the output signal of text speech data corresponding to the input/output characteristics of the first embodiment shown in FIG. 6E are the same in accordance with the limit of amplification. However, the minimum level of the output signal can be improved to PL' whose amplitude is two or more times as large as that of the prior art minimum level PL. Furthermore, a more intoned speech part of text speech data, which is easy to hear, can be output at a volume level that makes the part easy to hear, while a less intoned speech part that is hard to hear can be output at a volume level that makes the part adequately easy to hear.

The dictionary search function of the portable device 10 and the speech output control function of the speech output control device according to the first embodiment will be described.

Figure 7:
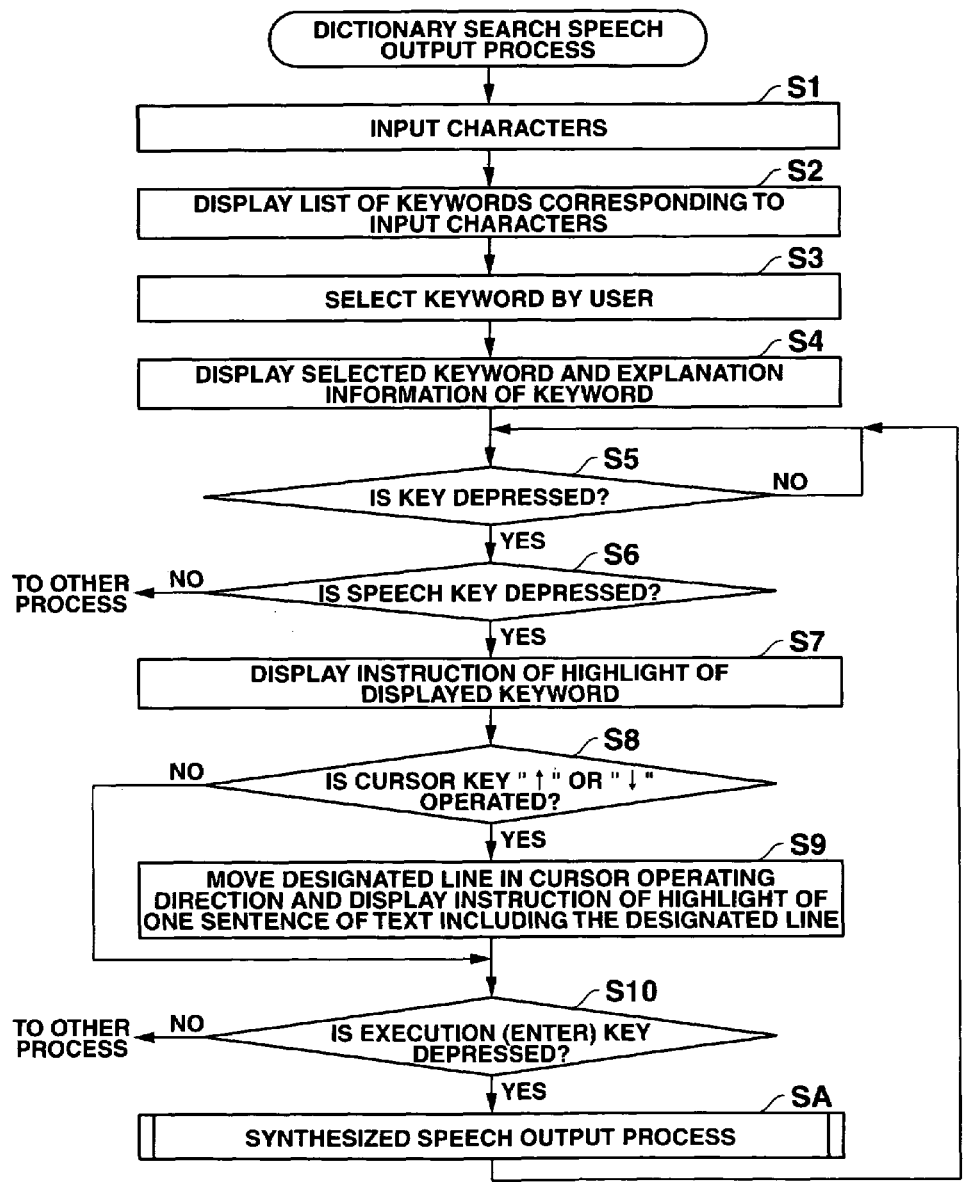
FIG. 7 is a flowchart of a dictionary search speech output process to be performed by the portable device 10.

FIG. 7 is a flowchart of a dictionary search speech output process to be performed by the portable device 10.

FIGS. 8A to 8D are illustrations of a display operation and a speech producing operation of a searched information display screen G1, which are performed in accordance with the dictionary search speech output process of the portable device 10.

When the dictionary search program 12a1 stored in the program ROM 12a is started up, characters for search are input in accordance with user's operation of the keyboard 14 and stored in the input character memory 12c1 in the RAM 12c (step S1). The dictionary data 12b1 stored in the database ROM 12b is searched for a keyword corresponding to the input characters, and the keyword is displayed on the display unit 17 a keyword list screen (not shown) (step S2).

In the displayed keyword list screen, a user selects a desired keyword by operating the keyboard 14 to move a cursor and depress an execution (enter) key (step S3). The selected keyword and its explanation information are read out of the dictionary data 12b1. They are stored in the searched keyword memory 12c2 and displayed on the display unit 17 as a searched information display screen G1 as shown in FIG. 8A (step S4).

Then, the device stands by for a key input signal (step S5). If a key input signal is input in accordance with the depression of a "speech" key 16a of the keyboard 14 (step S6), the keyword "education" displayed on the searched information display screen G1 is highlighted as indicated by H in FIG. 8B and its highlight display position information is stored in the keyword information designating position memory 12c3 (step S7).

Figures 8A, 8B, 8C, 8D:
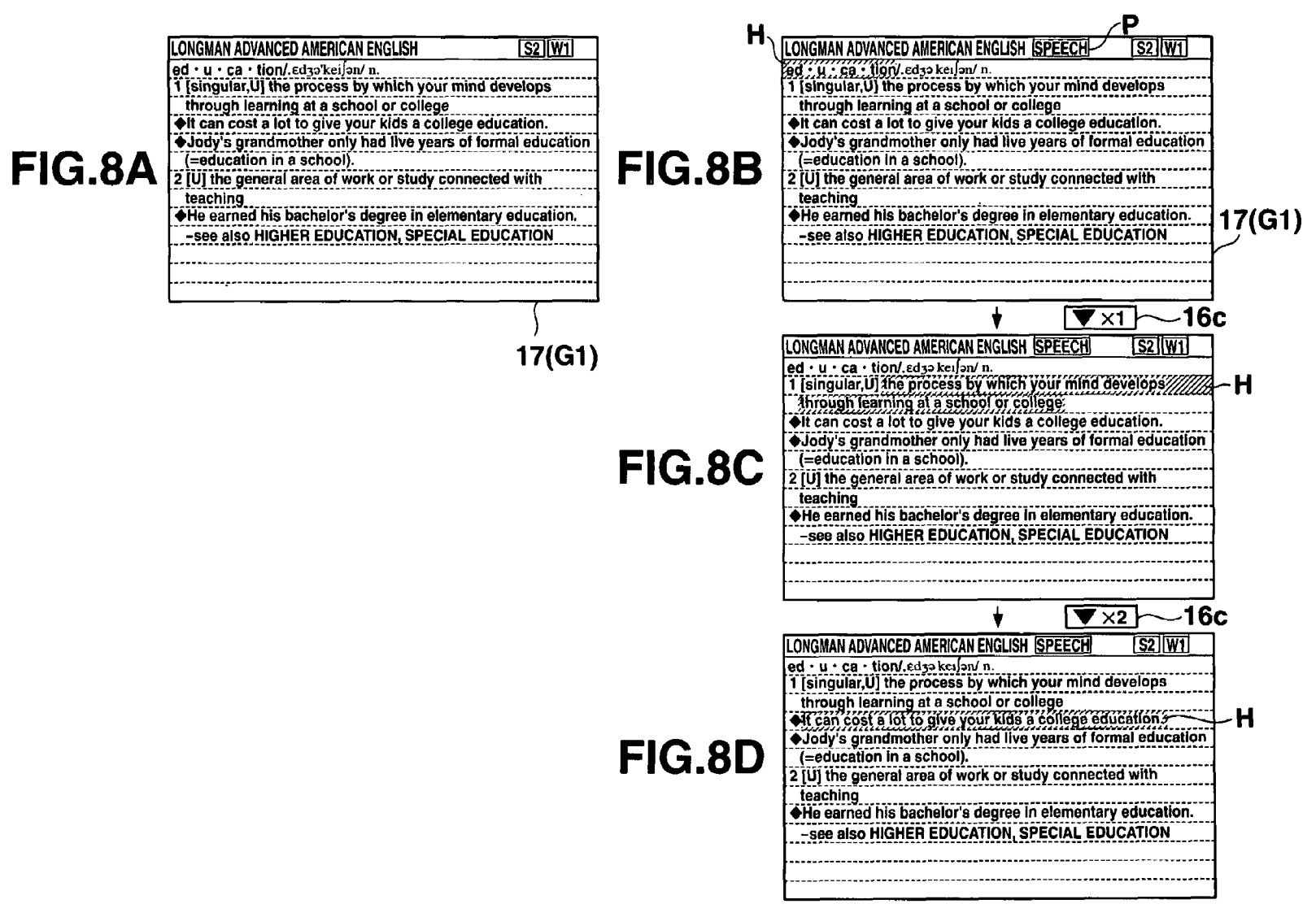

Referring to FIGS. 8C and 8D, when a key input signal is input by the down-arrow cursor key "↓" 16c, one row is designated and one sentence including the designated row is highlighted. Whenever a key input signal is input, the designated row is shifted in the direction of the arrow of the cursor key "↓", and the highlight display position information stored in the memory 12c3 is updated (steps S8 and S9).

If a key input signal is input in accordance with the depression of an "enter" key 16b of the keyboard 14 when the designated portions of the keyword and explanation information highlighted on the searched information display screen G1 are shifted to a user's desired portion (step S10), the device advances to a synthesized speech output process for outputting reading speech of text data of an example of the highlighted keyword and explanation information. Thus, the synthesized speech output program 12a2 is started and text speech data items of synthesized speech, which are produced in sequence by the speech synthesizing engine 21, are output from the speaker 18 in accordance with the speech output control process shown in FIG. 9 (step SA).

Figure 9:
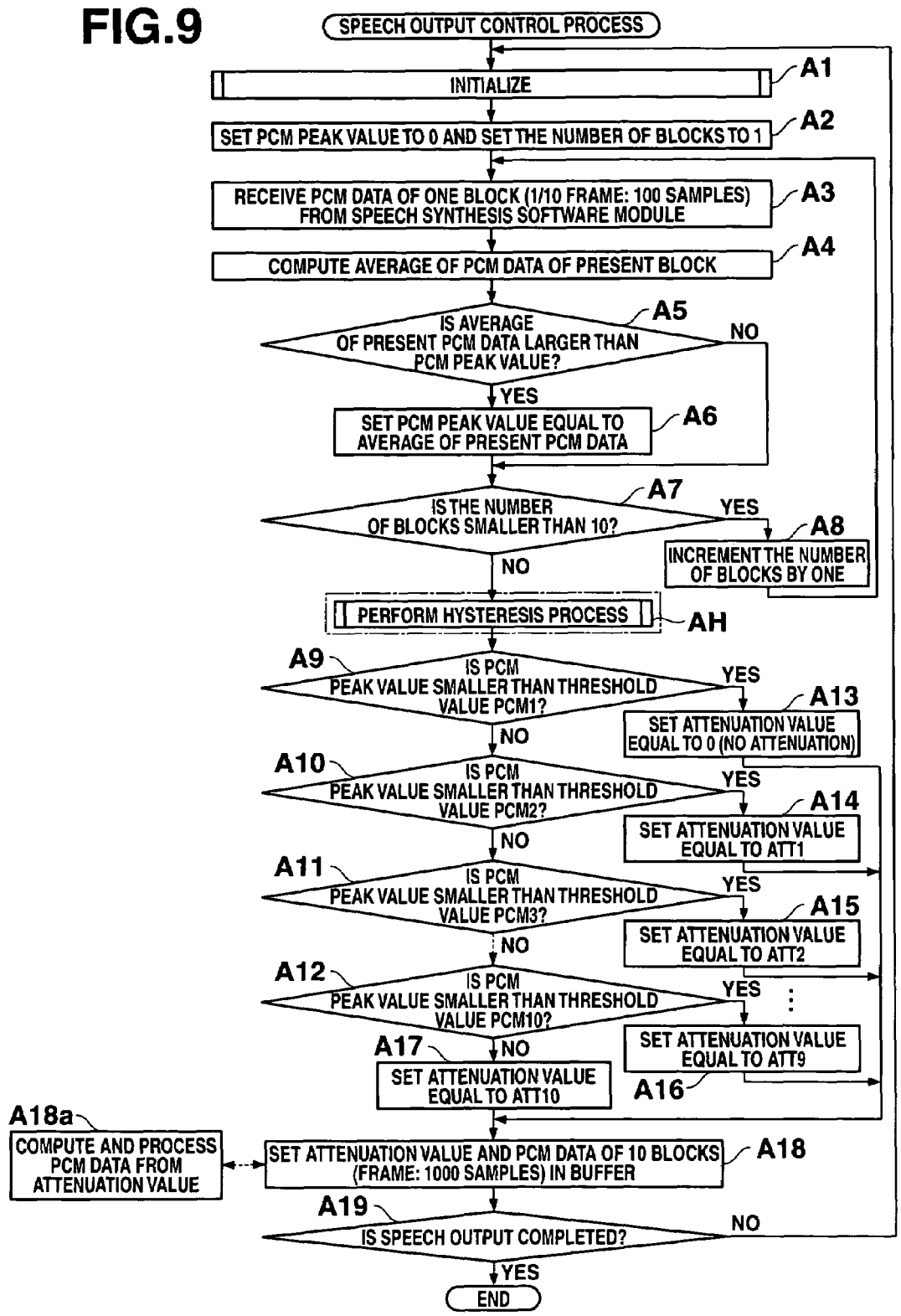
FIG. 9 is a flowchart showing a speech output control process of the speech output control device according to the first embodiment included in the portable device.

FIG. 9 is a flowchart showing a speech output control process of the speech output control device according to the first embodiment in the portable device 10.

First, the speech output control device shown in FIG. 2 is initialized to clear the ATT value computing unit 22, ATT setting unit 23, buffer memory (BUF1/BUF2) 12c6 in the RAM 12c, etc. to zero (step A1).

The PCM peak value is set to 0 and the number of blocks is set to 1 (step A2). The ATT value computing unit 22 extracts PCM data items of one block (1/10 frame: 100 samples) from text speech data of speech synthesized by the speech synthesizing engine 21 (step A3) (see FIG. 4C).

Then, the ATT value computing unit 22 computes an average of the extracted PCM data items (step A4), and determines whether the average is larger than the PCM peak value (initial value=0) in one frame (step A5).

If the computed average is larger than the PCM peak value detected so far from one frame, it is written as a new PCM peak value (step A6).

If the block whose PCM data items are currently extracted is located before the tenth block, or it does not reach the last one of the blocks in one frame (step A7), the number of blocks in one frame is incremented by one (step A8). The comparing and rewriting process as described above is repeated for the incremented block (steps A3 to A6).

If the block whose PCM data items are currently extracted is the tenth block (step A7), the PCM peak value is acquired from one frame for the PCM data items of speech synthesized by the speech synthesizing engine 21. The PCM peak value is compared with threshold values PCM1 to PCM10 on the basis of the ATT value setting table (12b3) (FIG. 5) stored in the database ROM 12b to determine which of the threshold values includes the PCM peak value (steps A9 to A12).

If the above PCM peak value is smaller than PCM 1 shown in the ATT value setting table (12b3) (FIG. 5), the ATT value is set to zero (no attenuation) (step A9→step A13). Together with the ATT value, the PCM data items for one frame (10 blocks: 1000 samples) are set in the buffer memory (BUF1/BUF2) 12c6 in the RAM 12c (step A18).

If the above PCM peak value is not smaller than PCM1 and smaller than PCM2, which are shown in the ATT value setting table (12b3) (FIG. 5), the ATT value is set to one (minimum attenuation ratio) (step A9→step A10→step A14). If the above PCM peak value is not smaller than PCM2 and smaller than PCM3, the ATT value is set to two (step A10→step A11→step A15). Together with the ATT value, the PCM data items for one frame (10 blocks: 1000 samples) are set in the buffer memory (BUF1/BUF2) 12c6 in the RAM 12c (step A18).

If the above PCM peak value is not smaller than PCM10, the ATT value is set to ten (maximum attenuation ratio) (step A12→step A17). Together with the ATT value, the PCM data items for one frame (10 blocks: 1000 samples) are set in the buffer memory (BUF1/BUF2) 12c6 in the RAM 12c (step A18).

The ATT value of the PCM data items set in the buffer memory (BUF1/BUF2) 12c6 is set in the digital attenuator 24 by the ATT setting unit 23. The PCM data items for one frame are DMA-transferred to the digital attenuator 24 and attenuated by the ATT value that is set in association with the peak value of the PCM data. After that, the PCM data items are converted into analog speech signals by the DAC 25. The analog speech signals are amplified by the amplifier 18a and output as speech from the speaker 18.

The above ATT value computing and setting process and the PCM data attenuating process are repeated until the synthesized speech producing and outputting process is completed (step A19→steps A1 to A18).

As shown in FIG. 6C, the maximum output level of the text speech signal output as synthesized speech can fall within the limit of amplification, while the text speech signal can be amplified at the amplification factor, which is obtained by raising the minimum output level by a value corresponding to the attenuation ratio at the maximum output level, and output at a volume level that makes the speech easy to hear.

According to the speech output control device according to the first embodiment, the synthesized speech of text data to be output as speech is generated as PCM data. The peak value of the PCM data for one frame (63 ms) is computed. The ATT value (attenuation ratio) of the PCM data for one frame is set on the basis of the ATT value setting table (12b3) for setting different ATT values (attenuation ratios) corresponding to the threshold values PCM1 to PCM10 of the PCM peak values. As the PCM peak values are larger, the PCM data is attenuated by a larger attenuation ratio to cause the output level to fall within the limit of amplification and raise the minimum output level. Not only text speech can be output such that it is easily heard at an adequate volume level without distorting any intoned speech part of the text speech or causing power-down due to an instantaneous increase in power load, but also its less-toned part can be amplified to such a high volume level that it is easy to hear.

In the speech output control device according to the first embodiment, as shown in FIG. 5, the ATT value (attenuation ratio) of one-frame PCM data is set according to which of a series of threshold values PCM1 to PCM10 described in the ATT value setting table (12b3) includes the PCM peak value of the PCM data. In this device, when the PCM peak value repeatedly varies near a certain threshold value, the range of the threshold value varies and so does the ATT value, thereby making the output speech unstable. To avoid this, the following process can be performed. As shown in FIGS. 10A and 10B, a first ATT value setting table 12b31 and a second ATT value setting table 12b32 are prepared. The first ATT value setting table 12b31 is the same as the ATT value setting table (12b3) shown in FIG. 5, and the second ATT value setting table 12b32 describes threshold values PCM1' to PCM10' which are obtained by varying the threshold values PCM1 to PCM10 of the first ATT value setting table 12b31 by a fixed width Δp. A hysteresis process A for selectively using the first and second ATT value setting tables 12b31 and 12b32 is performed according to whether the PCM peak value in the present frame is not smaller (the peak value increases) than or smaller (the peak value decreases) than that in its preceding frame.

FIGS. 10A and 10B are first and second ATT value setting tables 12b31 and 12b32 for setting an attenuation ratio (ATT value), which corresponds to the peak value of PCM data to be output as speech, by the hysteresis process A.

Figure 11:
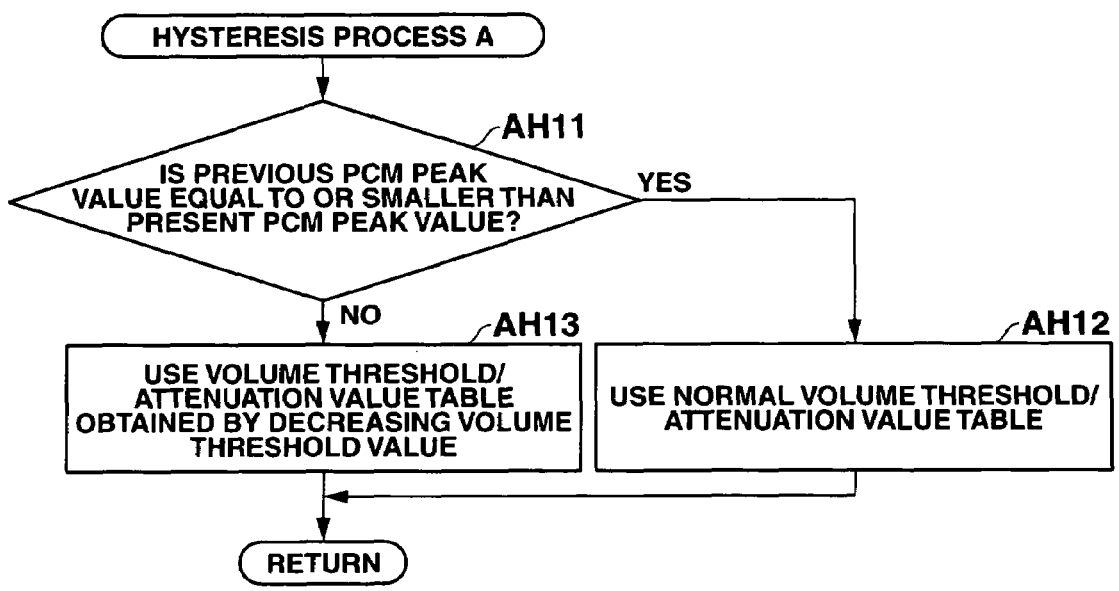
FIG. 11 is a flowchart of the hysteresis process A to selectively use the first and second ATT value setting tables in accordance with the direction of variation in the PCM peak value.

FIG. 11 is a flowchart of the hysteresis process A to selectively use the first and second ATT value setting tables 12b31 and 12b32 in accordance with the direction of variation in the PCM peak value.

The hysteresis process A shown in FIG. 11 is performed in step AH after steps A1 to A8 shown in FIG. 9 in which the PCM peak value of the present one-frame PCM data is obtained and before steps A9 to A18 in which the ATT value corresponding to the PCM peak value is set.

If the PCM peak value in the present frame of PCM data extracted by the ATT value computing unit 22 is not smaller than the PCM peak value in the preceding frame and the input level of the synthesized speech is increased, the first ATT value setting table 12b31 is used in accordance with the normal volume threshold values (PCM1 to PCM10) as shown in FIG. 10A (steps AH11 to AH12).

If the PCM peak value in the present frame of PCM data extracted by the ATT value computing unit 22 is smaller than the PCM peak value in the preceding frame and the input level of the synthesized speech is decreased, the second ATT value setting table 12b32 is used in accordance with the volume threshold values (PCM1' (=PCM1−ΔP1) to PCM10' (=PCM10−ΔP10)) which are obtained by decreasing the normal volume threshold values (PCM1 to PCM10) by fixed widths ΔP1- to ΔP10, respectively, as shown in FIG. 10B (steps AH11 to AH13).

Figure 12:
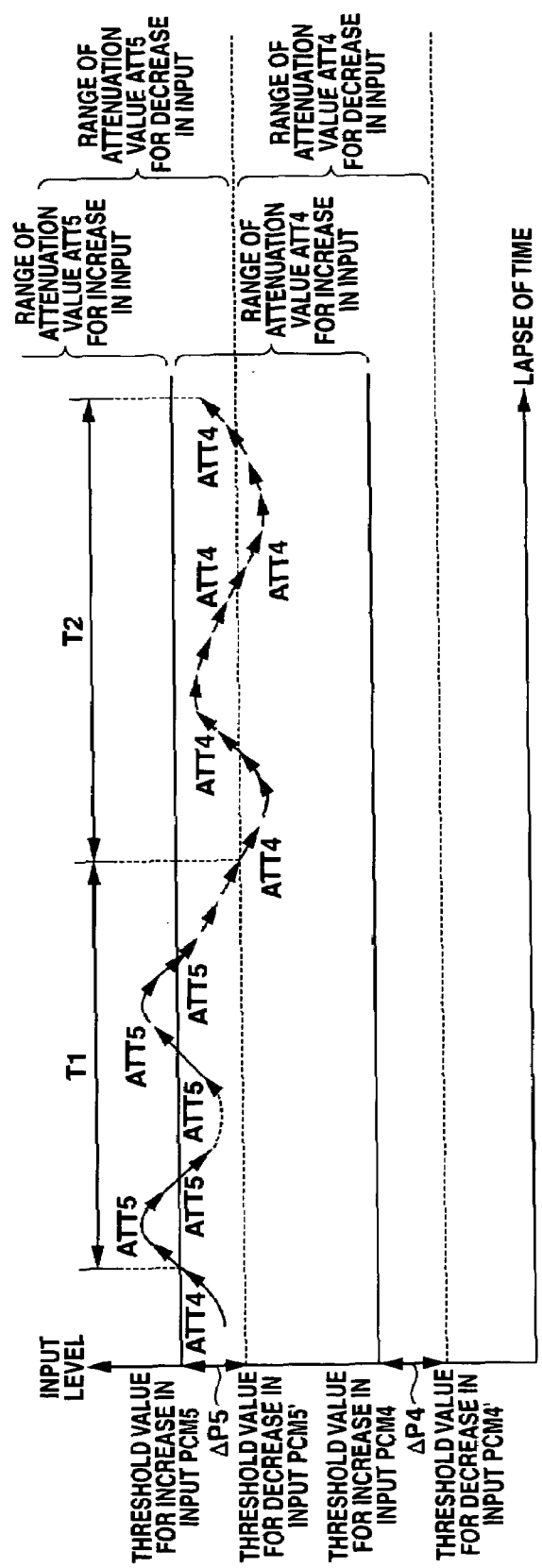
FIG. 12 is a chart showing a variation in the ATT value set in the speech output control process accompanying the hysteresis process A.

FIG. 12 is a chart showing a variation in the ATT value set in the speech output control process accompanying the hysteresis process A.

In timing T1 shown in FIG. 12, the PCM peak value of the presently input synthesized speech increases from that of the preceding synthesized speech and becomes not smaller than the volume threshold value PCM5 of the first ATT value setting table 12b31, and accordingly the ATT value varies from ATT4 to ATT5. Even though the PCM peak value becomes slightly smaller than the volume threshold value PCM5 immediately after the variation, the second ATT value setting table 12b32 is used and its volume threshold value is held to PCM5' or larger. The ATT value does not vary but remains ATT5. Even though the PCM peak value slightly varies near PCM5, the ATT value does not vary little by little or the output speech is not made unstable.

In timing T2 shown in FIG. 12, the PCM peak value of the presently input synthesized speech decreases from that of the preceding synthesized speech and becomes smaller than the volume threshold value PCM5' of the second ATT value setting table 12b32, and accordingly the ATT value varies from ATT5 to ATT4. Even though the PCM peak value becomes slightly larger than the volume threshold value PCM5' immediately after the variation, the first ATT value setting table 12b31 is used and its volume threshold value is held to smaller than PCM5'. The ATT value does not vary but remains ATT4. Even though the PCM peak value slightly varies near PCM5', the ATT value does not vary little by little or the output speech is not made unstable.

Figure 13:
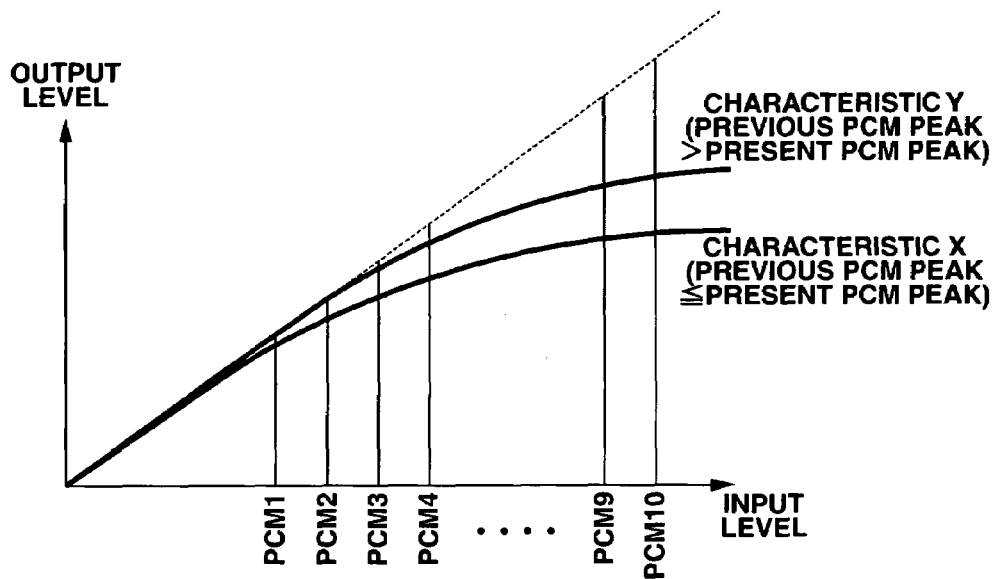
FIG. 13 is a graph showing variations in attenuation ratio characteristics X and Y for selectively setting two attenuation ratios (ATT values) by a hysteresis process B in accordance with the peak value of PCM data to be output as speech.

In the above hysteresis process A, the first and second ATT value setting tables 12b31 and 12b32 are used selectively in accordance with the direction of variation in the PCM peak value to thereby inhibit the ATT value from varying little by little near the volume threshold value PCMn (PCMn') and make the output speech stable. However, the following method can be applied as shown in FIG. 13. An ATT value setting table with characteristic X of a large amount of attenuation and an ATT value setting table with characteristic Y of a small amount of attenuation are prepared. A hysteresis process B for selectively using these ATT value setting tables is performed according to whether the PCM peak value of the present one-frame PCM data is not smaller (the peak value increases) or smaller (the peak value decreases) than the PCM peak value of the preceding one-frame PCM data. Thus, the ATT value can be set more effectively and stably when the PCM peak value increases or decreases.

FIG. 13 is a graph showing variations in attenuation ratio characteristics X and Y for selectively setting two attenuation ratios (ATT values) by the hysteresis process B in accordance with the peak value of PCM data to be output as speech.

Figure 14:
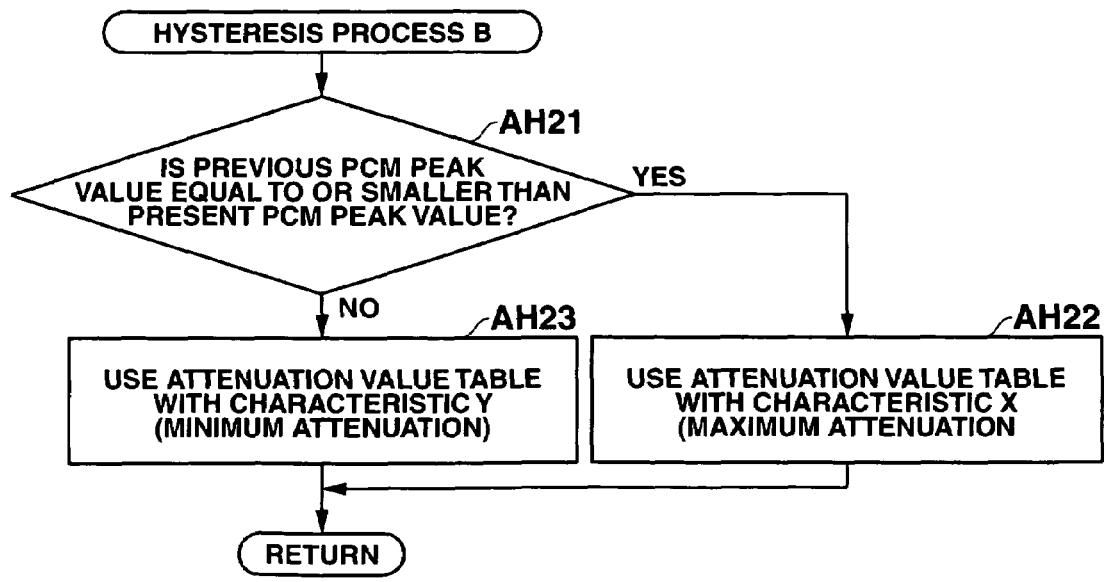
FIG. 14 is a flowchart showing the hysteresis process B for selectively using the ATT value setting table with characteristic X and the ATT value setting table with characteristic Y in accordance with the direction of variation in the PCM peak value.

FIG. 14 is a flowchart showing the hysteresis process B for selectively using the ATT value setting table with characteristic X and the ATT value setting table with characteristic Y in accordance with the direction of variation in the PCM peak value.

Like the hysteresis process A shown in FIG. 11, the hysteresis process B shown in FIG. 14 is performed in step AH after steps A1 to A8 shown in FIG. 9 in which the PCM peak value is obtained from the present frame and before steps A9 to A18 in which the ATT value corresponding to the PCM peak value is set.

If the PCM peak value in the present frame of PCM data extracted by the ATT value computing unit 22 is not smaller than the PCM peak value in the preceding frame and the input level of the synthesized speech is increased, the ATT value setting table with characteristic X is used as shown in FIG. 13 (steps AH21 to AH22).

If the PCM peak value in the present frame of PCM data extracted by the ATT value computing unit 22 is smaller than the PCM peak value in the preceding frame and the input level of the synthesized speech is decreased, the ATT value setting table with characteristic Y is used as shown in FIG. 13 (steps AH21 to AH23).

As described above, the ATT value setting table with characteristic X is selected when the PCM peak value of the present synthesized speech increases from that of the preceding synthesized speech, and the ATT value setting table with characteristic Y is selected when the PCM peak value decreases therefrom. When the speech level tends to rise and the load to the battery power supply increases, the amount of attenuation can be increased to prevent the lifetime of the battery power supply from being shortened and eliminate the fear of power-down. Moreover, when the speech level tends to drop and the load to the battery power supply decreases, the amount of attenuation can be decreased to maintain an adequate level of volume.

In the speech output control device according to the first embodiment, the ATT value computing unit 22 computes an ATT value of PCM data for each frame and the ATT setting unit 23 sets the ATT value in the digital attenuator 24. Thus, the PCM data that is DMA-transferred to the digital attenuator 24 is adjusted to a volume level corresponding to the ATT value. With reference to step A18a in the flowchart shown in FIG. 9 and FIGS. 15A to 15C, when one-frame PCM data and an ATT value corresponding to the peak value of the PCM data are transferred from the ATT value computing unit 22 to the buffer memory (BUF1/BUF2) 12c6 in the RAM 12c, the volume of the PCM data itself is increased or decreased from the ATT value for the preceding one-frame PCM data to that for the present one-frame PCM data. In this case, the digital attenuator 24 or the ATT setting unit 23 need not be required.

Figures 15A, 15B, 15C, 16:
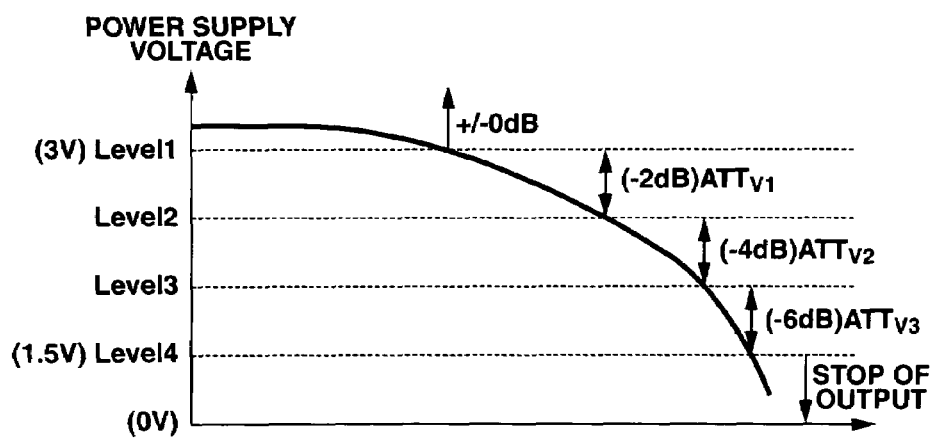
FIG. 15A is a chart of a first attenuation (ATT) process for PCM data of synthesized speech in the speech output control process of the speech output control device according to the first embodiment of the present invention.
FIG. 15B is a chart of a second attenuation (ATT) process for PCM data of synthesized speech in the speech output control process of the speech output control device according to the first embodiment of the present invention.
FIG. 15C is a chart of a third attenuation (ATT) process for PCM data of synthesized speech in the speech output control process of the speech output control device according to the first embodiment of the present invention.
FIG. 16 is a graph showing a relationship between an ATT value (attenuation ratio) setting characteristic and a power supply voltage detected when speech is output from a speech output control device according to a second embodiment of the present invention, which is included in the portable device (electronic dictionary)

FIGS. 15A to 15C are charts of an attenuation (ATT) process for PCM data of synthesized speech in the speech output control process of the speech output control device according to the first embodiment.

Assume that the ATT value of PCM data of the preceding frame is "−50" and the ATT value of PCM data of the present frame is "−120." When the PCM data of the present frame is transferred to the buffer memory (BUF1/BUF2) in the RAM 12c, it is gradually decreased 1 dB by 1 dB for each of one-sample data items PCM1 to PCMn, from "−51" corresponding to PCM1 to "−120" corresponding to PCMn, as shown in FIGS. 15A and 15B (step A18a).

When the ATT value of PCM data in the present frame is "−70," it is gradually increased 1 dB by 1 dB for each of one-sample data items PCM1 to PCMn, from "−119" corresponding to PCM1 to "−70" corresponding to PCMn, as shown in FIGS. 15B and 15C (step A18a).

As described above, since the digital attenuator 24 or the ATT setting unit 23 need not be required, the one-frame PCM data that is attenuated and transferred to the buffer memory (BUF1/IB2) 12c6 can be transferred directly to the DAC 25 and output as speech. The minimum volume level can be raised with the maximum volume level falling with the limit of amplification to thereby make the synthesized reading speech of text data easy to hear. Moreover, the ATT value of the ATT process performed when one-frame PCM data is output as speech can be increased or decreased continuously to output text speech not discontinuously but naturally.

In the speech output control device according to the first embodiment, the ATT value (attenuation ratio) of one-frame PCM data of synthesized speech is set in accordance with the PCM peak value for each frame, and the minimum volume level is raised while the maximum volume level is suppressed to fall within the limit of amplification not to cause power-down of the battery power supply.

Second Embodiment

FIG. 16 is a graph showing a relationship between an ATT value (attenuation ratio) setting characteristic and a power supply voltage detected when speech is output from a speech output control device according to a second embodiment of the present invention, which is included in the portable device (electronic dictionary) 10.

In the speech output control device according to the second embodiment, when the detected voltage V of a battery power supply B, which is output from a power supply circuit 19 to a CPU 11 when synthesized reading speech of text data is generated and output, drops to Level1 or lower, the ATT value (attenuation ratio) of PCM data of the synthesized reading speech is gradually set in accordance with the degree of drop of the voltage.

The ATT value is set to ATTv1 (−2 dB) when the detected voltage falls within the following range: Level1≧V>Level2, it is set to ATTv2 (−4 dB) when the detected voltage falls within the following range: Level2≧V>Level3, and it is set to ATTv3 (−6 dB) when the detected voltage falls within the following range: Level3≧V>Level4. When the detected voltage falls within the following range: Level4≧V, it becomes not higher than the lowest operating voltage of the CPU 11 and thus the speech output operation itself is stopped.

Figure 17:
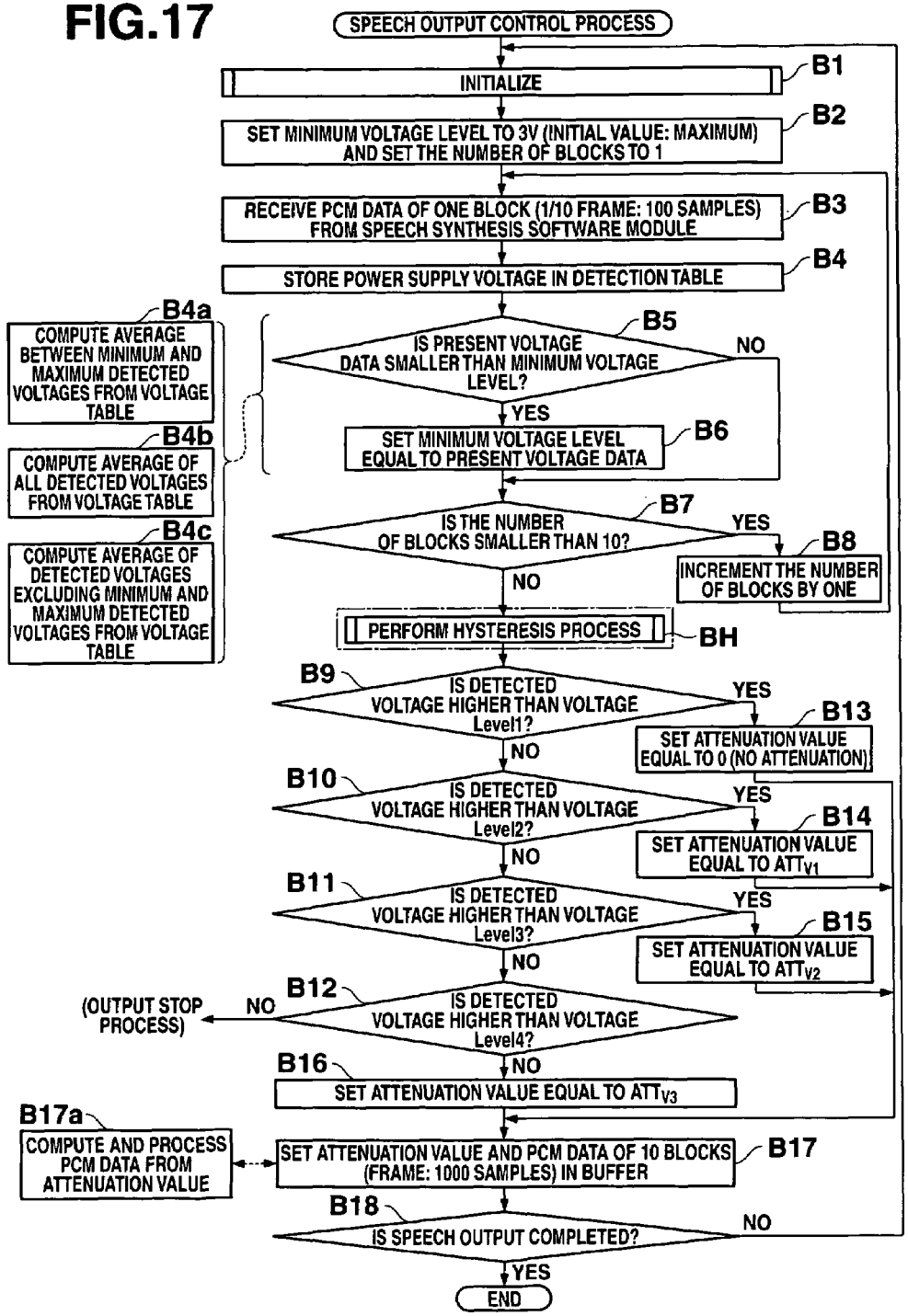
FIG. 17 is a flowchart showing a speech output control process of the speech output control device according to the second embodiment of the present invention.

FIG. 17 is a flowchart showing a speech output control process of the speech output control device according to the second embodiment of the present invention.

In the second embodiment, first, a speech output control device as shown in FIG. 2 is initialized to clear an ATT value computing unit 22, an ATT setting unit 23, a buffer memory (BUF1/BUF2) 12c6 in a RAM 12c, etc. to zero (step B1).

The minimum level of a detected voltage is set to 3 V (initial value: maximum) and the number of blocks is set to 1 (step B2). The ATT value computing unit 22 extracts PCM data of one block (1/10 frame: 100 samples) from text speech data of speech synthesized by a speech synthesizing engine 21 (step B3) (see FIG. 4C).

The voltage of the battery power supply B is output from the power supply circuit 19 and its level V is detected and stored in a detected voltage recording table (not shown) (step B4). It is determined whether or not the presently recorded detected power supply voltage is lower than the minimum level (3 V=initial level) of the preceding detected voltage (step B5).

When it is determined that the present detected power supply voltage is lower than the minimum level (3 V=initial level) of the preceding detected voltage, the present detected power supply voltage is rewritten as the minimum detected voltage (step B6).

If a block whose PCM data is currently extracted is located before the tenth block, or it does not reach the last one of the blocks in one frame (step B7), the number of blocks in one frame is incremented by one (step B8). The power supply voltage detecting process and the comparing and rewriting process for comparing the detected power supply voltages, as described above, are repeated for the incremented block (steps B3 to B6).

If a block whose PCM data is currently extracted is the tenth block (step B7), the minimum level (minimum voltage) of the power supply voltage detected when one-frame PCM data of speech synthesized by the speech synthesizing engine 21 is output, is acquired. The minimum level is compared with threshold voltage levels Level1 to Level4 on the basis of the ATT value (attenuation ratio) setting characteristics corresponding to the power supply voltages shown in FIG. 16, thereby determining which of the threshold voltage levels includes the minimum level (steps B9 to B12).

If the above minimum level (minimum voltage) is higher than Level1 of the maximum voltage level (3 V) represented by an ATT value setting characteristic (12b3) (see FIG. 16), the ATT value is equal to zero (no attenuation) (step B9→step B13). Together with the ATT value, the PCM data for the present frame (10 blocks: 1000 samples) is set in the buffer memory (BUF1/BUF2) 12c6 in the RAM 12c (step B17).

If the above minimum level (minimum voltage) is not higher than Level1 and higher than Level2, represented by the ATT value setting characteristic (12b3) (see FIG. 16), the ATT value is set to ATTv1 (minimum attenuation ratio) (step B9→step B10→step B14). If the above minimum level is higher than Level3, the ATT value is set to ATTv2 (step B10→step B11→step B15). Together with the ATT value, the PCM data for the present frame (10 blocks: 1000 samples) is set in the buffer memory (BUF1/BUF2) 12c6 in the RAM 12c (step B17).

If the above minimum level (minimum voltage) is not higher than Level3 and higher than Level4, the ATT value is set to ATTv3 (maximum attenuation ratio) (step B12→step B16). Together with the ATT value, the PCM data for one frame (10 blocks: 1000 samples) is set in the buffer memory (BUF1/BUF2) 12c6 in the RAM 12c (step B17).

The ATT value of the PCM data set in the buffer memory (BUF1/BUF2) 12c6 is set in a digital attenuator 24 by the ATT setting unit 23. The PCM data is DMA-transferred to the digital attenuator 24 and attenuated by the ATT value that is set in association with the presently detected power supply voltage. After that, the PCM data is converted into an analog speech signal by the DAC 25. The analog speech signal is amplified by an amplifier 18*a* and output as speech from a speaker 18.

The process of computing and setting an ATT value corresponding to the power supply voltage detected for each frame and the process of attenuating PCM data of the frame in accordance with the ATT value are repeated in sequence until the process of producing and outputting synthesized speech of text data to be output is completed (step B18→steps B1 to B17).

The text speech signal output as synthesized speech is amplified and output at such a volume level that the speech can easily be heard at the minimum output level. If there is fear that the detected voltage of the battery power supply B will drop to exhaust and power down the battery power supply suddenly, the output level of the speech is effectively inhibited from being attenuated. Accordingly, a continuation operation can be protected and so can be the power supply.

According to the speech output control device according to the second embodiment, the minimum volume level is raised by increasing the amplification factor of the amplifier 18*a*, and the synthesized speech of text data to be output as speech is generated as PCM data. When the PCM data is output as speech for each frame (63 ms), the voltage of the battery power supply B is detected. Different ATT values (attenuation ratios) are set in accordance with the threshold values Level1 to Level4 corresponding to the levels of the detected power supply voltage. As the power supply voltage decreases more greatly, the PCM data is attenuated by a larger attenuation ratio to reduce the load to the battery power supply B. Not only text speech can be output such that it is easily heard at an adequate volume level without causing power-down due to an instantaneous increase in power load in an intoned part of the text speech, but also its less-toned part can be amplified to such a high volume level that it is easy to hear.

In the speech output control device according to the second embodiment, when one-frame PCM data of synthesized speech is output, the minimum level of the power supply voltage is detected (steps B4 to B6), and a different ATT value is set in accordance with the detected minimum level (steps B9 to steps B16). However, the different ATT value can be set in accordance with not the minimum level of the power supply voltage but the average (step B4*a*) of the minimum and maximum levels of the detected power supply voltages.

The average of all levels of the power supply voltage detected when one-frame PCM data is output can be obtained (step B4*b*) and a different ATT value corresponding to the average can be set.

Furthermore, the average of all levels of the detected power supply voltage except the minimum and maximum levels can be obtained (step B4*c*) and a different ATT value corresponding to the average can be set.

In the speech output control device according to the second embodiment, as shown in FIG. 16, the ATT value (attenuation ratio) of one-frame PCM data is set in accordance with a series of voltage threshold levels Level1 to Level4 described in the ATT value setting characteristic (12*b*3) corresponding to a detected power supply voltage. In this device, when the power supply voltage detected for each frame repeatedly varies near a certain voltage threshold level Leveln, the range of the voltage threshold level Leveln varies and so does the set ATT value, thereby making the output speech unstable. To avoid this, the following process can be performed. As shown in FIGS. 18A and 18B, a first power supply voltage level/ATT value setting table 12*b*33 and a second power supply voltage level/ATT value setting table 12*b*34 are prepared. The first table 12*b*33 corresponds to the ATT value setting characteristic (12*b*3) shown in FIG. 16, and the second table 12*b*34 describes voltage threshold levels which are obtained by varying the voltage threshold levels Level1 to Level4 of the first table 12*b*33 by widths ΔV1 to ΔV4, respectively. A hysteresis process A for selectively using the first and second tables 12*b*33 and 12*b*34 is performed according to whether the power supply voltage detected when the present one-frame data is output is lower (the voltage drops) than or not smaller (the voltage rises) than that detected when the preceding one-frame data is output.

FIGS. 18A and 18B are first and second power supply voltage level/ATT value setting tables 12*b*33 and 12*b*34 for setting an attenuation ratio (ATT value), which corresponds to the power supply voltage detected when PCM data is output as speech, by the hysteresis process A.

FIG. 19 is a flowchart of the hysteresis process A to selectively use the first and second power supply voltage level/ATT value setting tables 12*b*33 and 12*b*34 in accordance with the direction of variation in the detected power supply voltage.

The hysteresis process A shown in FIG. 19 is performed in step BH after steps B1 to B8 shown in FIG. 17 in which the minimum power supply voltage level is detected when the present one-frame PCM data is output and before steps B9 to B17 in which the ATT value corresponding to the minimum power supply voltage level is set.

If the power supply voltage detected when the present one-frame PCM data, which is extracted by the ATT value computing unit 22, is output is lower than that detected when the preceding one-frame PCM data is output and the load of the power supply is increased, the first power supply voltage level/ATT value setting table 12*b*33 is used in accordance with the normal volume threshold levels (Level1 to Level4) as shown in FIG. 18A (steps BH11 to BH12).

If the power supply voltage detected when the present one-frame PCM data, which is extracted by the ATT value computing unit 22, is output is not lower than that detected when the preceding one-frame PCM data is output and the load of the power supply is decreased, the second power supply voltage level/ATT value setting table 12*b*34 is used in accordance with the voltage threshold levels (Level1' (=Level1+ΔV1) to Level4' (=Level4+ΔV4)) which are obtained by increasing the normal voltage threshold levels (Level1 to Level4) by widths ΔV1 to ΔV4, respectively, as shown in FIG. 18B (steps BH11 to BH13).

FIG. 20 is a chart showing a variation in the ATT value set in the speech output control process accompanying the hysteresis process A.

In timing T1 shown in FIG. 20, the power supply voltage detected when the present one-frame PCM data is output decreases from that detected when the preceding one-frame PCM data is output and becomes lower than the voltage threshold level Level3 of the first power supply voltage level/ATT value setting table 12*b*33, and accordingly the ATT value varies from ATT2 to ATT3. Even though the detected power supply voltage becomes slightly higher than the voltage threshold level Level3 of the first power supply voltage level/ATT value setting table 12*b*33 immediately after the variation, the second power supply voltage level/ATT value setting table 12*b*34 is used and its voltage threshold level is held to lower than Level3'. The ATT value does not vary but remains ATT3. Even though the detected power supply voltage slightly varies near Level3, the ATT value does not vary little by little or the output speech is not made unstable.

In timing T2 shown in FIG. 20, the power supply voltage detected when the present one-frame PCM data is output rises from that detected when the preceding one-frame PCM data is output and becomes not lower than the voltage threshold level Level3' of the second power supply voltage level/ATT value setting table 12b34, and accordingly the ATT value varies from ATT3 to ATT2. Even though the detected power supply voltage becomes slightly lower than the voltage threshold level Level3' of the second power supply voltage level/ATT value setting table 12b34 immediately after the variation, the first power supply voltage level/ATT value setting table 12b33 is used and its voltage threshold level is held to Level3 or higher. The ATT value does not vary but remains ATT2. Even though the detected power supply voltage slightly varies near Level3', the ATT value does not vary little by little or the output speech is not made unstable.

Figure 21:
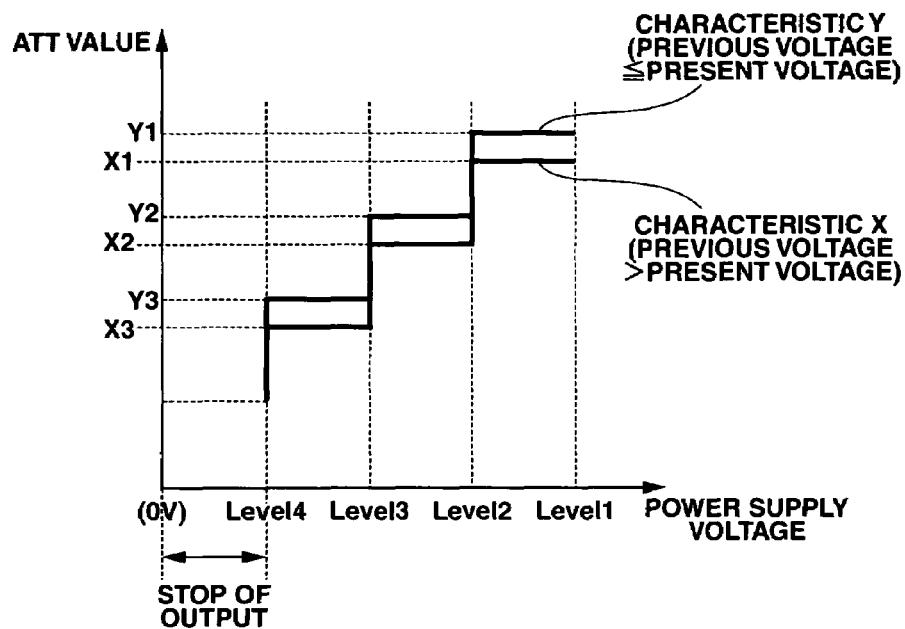
FIG. 21 is a graph showing variations in attenuation ratio characteristics X and Y for selectively setting two attenuation ratios (ATT values) by the hysteresis process B in accordance with the power supply voltage detected when PCM data is output as speech.

In the above hysteresis process A, the first and second power supply voltage level/ATT value setting table 12b33 and 12b34 are used selectively in accordance with the direction of variation in the detected power supply voltage to thereby inhibit the ATT value from varying little by little near the voltage threshold level Leveln (Leveln') and make the output speech stable. However, the following method can be applied as shown in FIG. 21. A power supply voltage level/ATT value setting table with characteristic X of a large amount of attenuation and a power supply voltage level/ATT value setting table with characteristic Y of a small amount of attenuation are prepared. A hysteresis process B for selectively using these tables is performed according to whether the power supply voltage detected when the present one-frame PCM data is output is lower than (the voltage drops) or not lower than (the voltage rises) that detected when the preceding one-frame PCM data is output. Thus, the ATT value can be set more effectively and stably when the power supply voltage tends to drop or rise.

FIG. 21 is a graph showing variations in attenuation ratio characteristics X and Y for selectively setting two attenuation ratios (ATT values) by the hysteresis process B in accordance with the power supply voltage detected when PCM data is output as speech.

Figure 22:
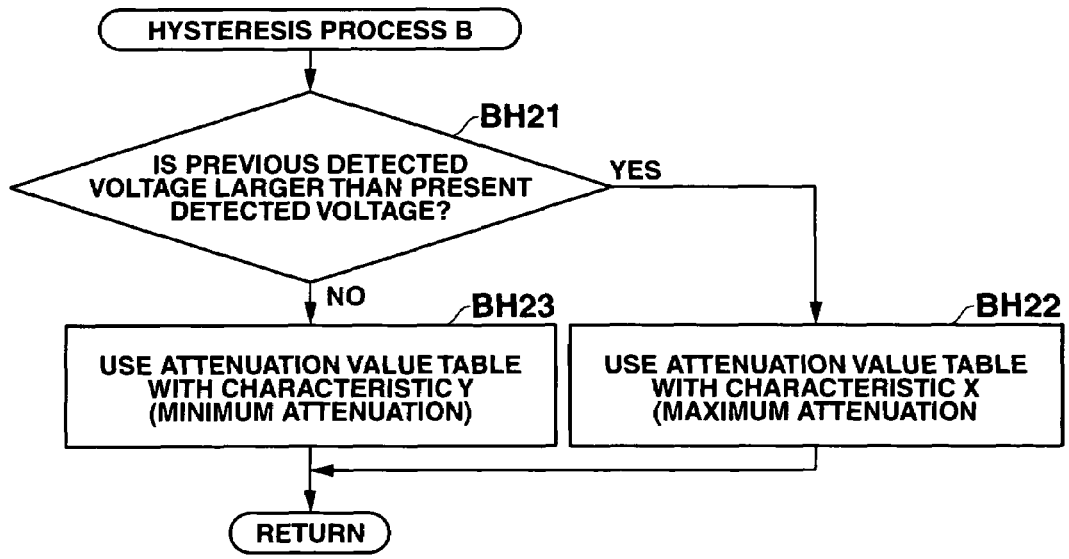
FIG. 22 is a flowchart showing the hysteresis process B for selectively using the power supply voltage level/ATT value setting table with characteristic X and the power supply voltage level/ATT value setting table with characteristic Y in accordance with the direction of variation in the detected power supply voltage.

FIG. 22 is a flowchart showing the hysteresis process B for selectively using the power supply voltage level/ATT value setting table with characteristic X and the power supply voltage level/ATT value setting table with characteristic Y in accordance with the direction of variation in the detected power supply voltage.

Like the hysteresis process A shown in FIG. 19, the hysteresis process B shown in FIG. 22 is performed in step BH after steps B1 to B8 of the speech output control process of the second embodiment shown in FIG. 17, in which the minimum power supply voltage level is detected when the present one-frame PCM data is output, and before steps B9 to B17 in which the ATT value corresponding to the minimum power supply voltage level is set.

If the power supply voltage detected when the present one-frame PCM data extracted by the ATT value computing unit 22 is output is lower than that detected when the preceding one-frame PCM data is output and the power supply voltage drops, the power supply voltage level/ATT value setting table with characteristic X is used as shown in FIG. 21 (steps BH21 to BH22).

If the power supply voltage detected when the present one-frame PCM data extracted by the ATT value computing unit 22 is output is not lower than that detected when the preceding one-frame PCM data is output and the power supply voltage rises and the load of the power supply decreases, the power supply voltage level/ATT value setting table with characteristic Y is used as shown in FIG. 21 (steps BH21 to BH23).

As described above, the power supply voltage level/ATT value setting table with characteristic X is selected if the power supply voltage detected when the present synthesized speech is output drops from the power supply voltage detected when the preceding synthesized speech is output, and the power supply voltage/ATT value setting table with characteristic Y is selected if it rises therefrom. When the power supply voltage tends to drop and the battery power supply is greatly exhausted, the amount of attenuation can be increased to prevent the lifetime of the battery power supply from being shortened and eliminate the fear of power-down. Moreover, when the power supply voltage tends to rise and the load to the battery power supply decreases, the amount of attenuation can be decreased to maintain an adequate level of volume.

In the speech output control device according to the second embodiment, the ATT value computing unit 22 computes an ATT value of one-frame PCM data and the ATT setting unit 23 sets the ATT value in the digital attenuator 24. Thus, one-frame PCM data that is DMA-transferred to the digital attenuator 24 is adjusted to a volume level corresponding to the ATT value. With reference to step B17a in the flowchart shown in FIG. 17 and FIGS. 15A to 15C, when one-frame PCM data and an ATT value corresponding to the detected power supply voltage for the PCM data are transferred from the ATT value computing unit 22 to the buffer memory (BUF1/BUF2) 12c6 in the RAM 12c, the volume of the PCM data itself is increased or decreased gradually from the ATT value for the PCM data in the preceding frame to the ATT value for the preceding one-frame PCM data to that for the present one-frame PCM data. In this case, the digital attenuator 24 or the ATT setting unit 23 need not be required.

Since the digital attenuator 24 or the ATT setting unit 23 need not be required as described above, one-frame PCM data that is attenuated and transferred to the buffer memory (BUF1/BUF2) 12c6 can be transferred directly to the DAC 25 and output as speech. The minimum volume level can be raised with the maximum volume level falling with the limit of amplification not to cause power-down, thereby making the synthesized reading speech of text data easy to hear. Moreover, the ATT value of the ATT process performed when one-frame PCM data is output as speech can be increased or decreased continuously to output text speech not discontinuously but naturally.

In the speech output control device according to the first embodiment, the ATT value (attenuation ratio) of one-frame PCM data of synthesized speech is set in accordance with the PCM peak value for each frame, and the minimum volume level is raised while the maximum volume level is suppressed to fall within the limit of amplification not to cause power-down of the battery power supply. In the speech output control device according to the second embodiment, the amplification factor of the amplifier 18a is increased in advance to raise the minimum volume level, and the ATT value (attenuation ratio) for each of frames PCM data is set in accordance with the drop in the power supply voltage thereby to suppress power-down of the battery power supply and lengthening the lifetime thereof.

Third Embodiment

Figure 23A:
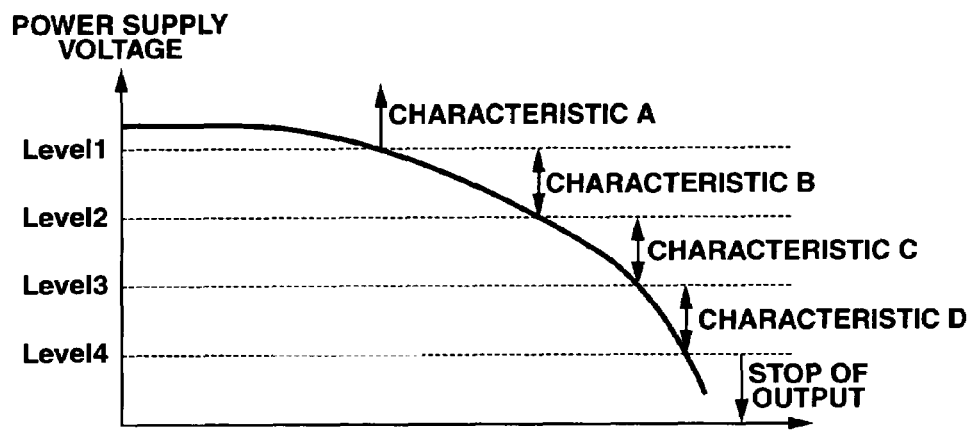
FIG. 23A is a graph showing a relationship between a power supply voltage detected when speech is output from a speech output control device according to a third embodiment of the present invention, which is included in the portable device (electronic dictionary), and four ATT value (attenuation ratio) setting characteristics A to D selectively used in accordance with the power supply voltage.
Figure 23B:
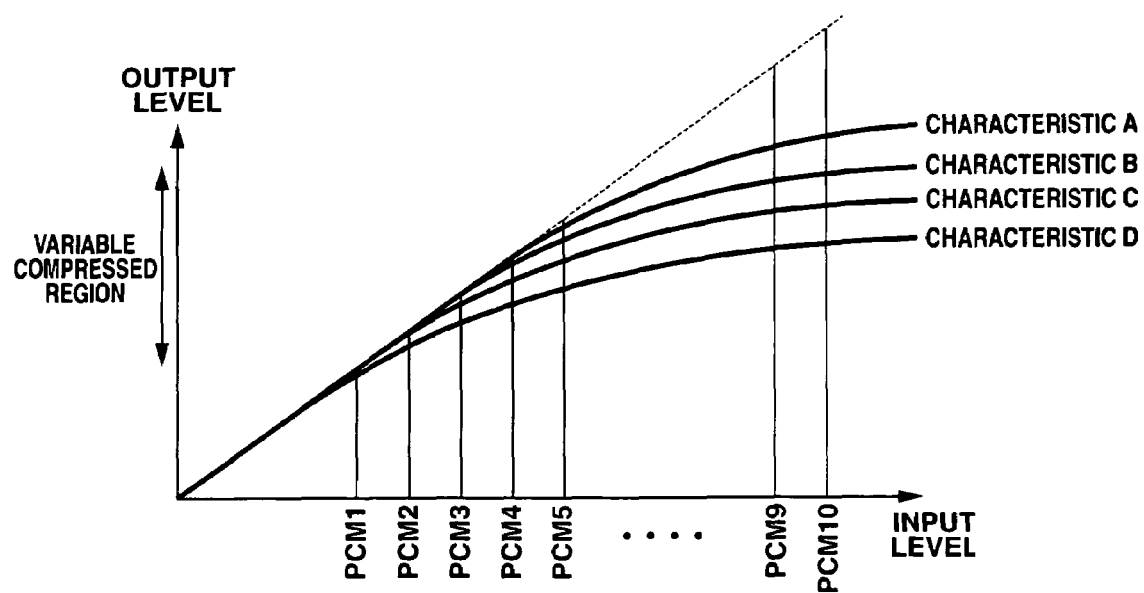
FIG. 23B is a graph showing a relationship between the output speech and the ATT value setting characteristics A to D.

FIGS. 23A and 23B are graphs showing four ATT value (attenuation ratio) setting characteristics A to D selectively used in accordance with a power supply voltage detected when speech is output from a speech output control device according to a third embodiment of the present invention, which is included in the portable device (electronic dictionary) 10. More specifically, FIG. 23A is a graph showing a relationship between the power supply voltage and the ATT value setting characteristics A to D, and FIG. 23B is a graph showing a relationship between the output speech and the ATT value setting characteristics A to D.

In the speech output control device according to the third embodiment, when the detected voltage V of a battery power supply B, which is output from a power supply circuit 19 to a CPU 11 when synthesized reading speech of text data is generated and output, is higher than Level1, an ATT value setting table with a first (minimum) attenuation characteristic A is selected. When the detected voltage falls within the following range: Level1≧V>Level2, an ATT value setting table with a second attenuation characteristic B is selected. When the detected voltage falls within the following range: Level2≧V>Level3, an ATT value setting table with a third attenuation characteristic C is selected. When the detected voltage falls within the following range: Level3≧V>Level4, an ATT value setting table with a fourth (maximum) attenuation characteristic D is selected. When the detected voltage falls within the following range: Level4≧V, it becomes not higher than the lowest operating voltage of the CPU 11 and thus the speech output operation itself is stopped.

On the basis of the ATT value setting tables with different attenuation characteristics selected in response to the detected power supply voltage V, attenuation ratios (ATT values) ATT1 to ATT10 corresponding to PCM peak values PCM1 to PCM10 of an input speech signal. As the detected power supply voltage V drops and the PCM peak value rises, a larger amount of attenuation is set to attenuate PCM data of a synthesized speech signal. While the minimum volume level is raised, power-down of a battery power supply B is suppressed and the lifetime thereof is lengthened.

FIG. 24 is a flowchart showing a first speech output control process of the speech output control device according to the third embodiment of the present invention.

FIG. 25 is a flowchart showing a second speech output control process of the speech output control device according to the third embodiment of the present invention.

In the speech output control process in the third embodiment, first, the speech output control device as shown in FIG. 2 is initialized to clear an ATT value computing unit 22, an ATT setting unit 23, a buffer memory (BUF1/BUF2) 12c6 in a RAM 12c, etc. to zero (step C1).

The PCM peak value is set to zero, the minimum detected voltage level is set to 3 V (initial value: maximum) and the number of blocks is set to 1 (step C2). The ATT value computing unit 22 extracts PCM data of one block (1/10 frame: 100 samples) from text speech data of speech synthesized by a speech synthesizing engine 21 (step C3) (see FIG. 4C).

The voltage of the battery power supply B is output from the power supply circuit 19 and its level V is detected and stored in a detected voltage recording table (not shown) (step C4).

The average of one-block (100 samples) PCM data presently extracted in step C3 is computed (step C5). It is determined whether the computed average is larger than the PCM peak value (initial level="0") in one frame (step C6).

When it is determined that the computed average is larger than the PCM peak value detected so far from one frame, it is written as a new PCM peak value (step C7).

It is also determined whether or not the present detected power supply voltage stored in the detected voltage recording table in step C4 is lower than the minimum level (3 V=initial level) of the last detected voltage (step C8).

When it is determined that the present detected power supply voltage is lower than the minimum level (3 V=initial level) of the last detected voltage, the present detected power supply voltage is rewritten as the minimum detected voltage (step C9).

If a block whose PCM data is currently extracted is located before the tenth block, or it does not reach the last one of the blocks in one frame (step C10), the number of blocks in one frame is incremented by one (step C11). The comparing and rewriting process for comparing the average with the PCM peak value, the power supply voltage detecting process, and the comparing and rewriting process for comparing the detected power supply voltage with the minimum voltage, as described above, are repeated for the incremented block (steps C3 to C9).

If a block whose PCM data is currently extracted is the tenth block (step C10), the minimum level (minimum voltage) of the power supply voltage V detected when one-frame PCM data of speech synthesized by the speech synthesizing engine 21 is output, is acquired. The PCM peak value of one frame is thus obtained.

The minimum level of the detected power supply voltage V is compared with voltage threshold levels Level1 to Level4 for selecting ATT value (attenuation ratio) setting characteristics A to D corresponding to the power supply voltages shown in FIGS. 23A and 23B, thereby determining which of the voltage threshold levels includes the minimum level (steps C12 to C15).

If the minimum level of the power supply voltage detected when the present one-frame PCM data of synthesized speech is output is higher than Level1 of the maximum voltage level (3 V) represented by the ATT value setting characteristic (see FIG. 23A), the ATT value setting table with the first (minimum) attenuation characteristic A is selected as shown in FIG. 23B (step C12→step C16).

If the minimum level is not higher than Level1 and higher than Level2, represented by the ATT value setting characteristic (see FIG. 23A), the ATT value setting table with the second attenuation characteristic B is selected as shown in FIG. 23B (step C13→step C17).

If the minimum level is not higher than Level2 and higher than Level3, the ATT value setting table with the third attenuation characteristic C is selected as shown in FIG. 23B (step C14→step C18).

If the minimum level is not higher than Level3 and higher than Level4, the ATT value setting table with the fourth (maximum) attenuation characteristic D is selected as shown in FIG. 23B (step C15→step C19).

When one of the ATT value setting tables with first to fourth attenuation characteristics A to D is selected in accordance with the power supply voltage V detected when PCM data of one frame is output, the PCM peak value in the one frame is compared with its threshold values PCM1 to PCM10 in accordance with the selected one of the ATT value setting tables (FIG. 23B), and it is determined which of the PCM threshold values includes the PCM peak value (steps C20 to C23).

If the PCM peak value of PCM data of synthesized speech in one frame is smaller than PCM1, the ATT value is equal to zero (no attenuation) (step C20→step B24). Together with the ATT value, the PCM data for the one frame (10 blocks: 1000 samples) is set in the buffer memory (BUF1/BUF2) 12c6 in the RAM 12c (step C29).

If the above PCM peak value is not smaller than PCM1 and smaller than PCM2, the ATT value shown in one of the ATT value setting tables, which is selected in accordance with the detected power supply voltage V, is set to 1 (minimum attenuation ratio) (step C20→step C21→step C25). If the above PCM peak value is not smaller than PCM2 and smaller than PCM3, the ATT value shown in the selected ATT value setting table is set to 2 (step C21→step C22→step C26). Together with the ATT value, the PCM data for the one frame (10 blocks: 1000 samples) is set in the buffer memory (BUF1/BUF2) 12c6 in the RAM 12c (step C29).

If the above PCM peak value is not smaller than PCM10, the ATT value shown in the selected ATT value setting table is set to 10 (maximum attenuation ratio) (step C23→step C28). Together with the ATT value, the PCM data for the one frame (10 blocks: 1000 samples) is set in the buffer memory (BUF1/BUF2) 12c6 in the RAM 12c (step C29).

The ATT value, which is determined in accordance with the power supply voltage V and the PCM peak value detected when one-frame PCM data is output from the buffer memory (BUF1/BUF2) 12c6, is set in the ATT setting unit 23, and the attenuation ratio of a digital attenuator 24 is set. The one-frame PCM data is DMA-transferred to the digital attenuator 24 and attenuated by the ATT value (attenuation ratio) that is set in accordance with the detected power supply voltage V and PCM peak value. After that, the PCM data is converted into an analog speech signal by the DAC 25. The analog speech signal is amplified by an amplifier 18a and output as speech from a speaker 18.

The process of computing and setting an ATT value corresponding to the power supply voltage V and PCM peak value detected for each frame and the process of attenuating PCM data of the frame in accordance with the ATT value are repeated in sequence until the process of producing and outputting synthesized speech of text data to be output is completed (step C30→steps C1 to C2).

The text speech signal output as synthesized speech falls within the limit of amplification at the maximum output level, while it is amplified at the amplification factor increased by a value corresponding to the attenuation ratio at the maximum output level and thud the speech can easily be heard at the minimum output level.

The text speech signal output as synthesized speech is amplified and output at such a volume level that the speech can easily be heard at the minimum output level. If there is fear that the detected voltage V of the battery power supply B will drop to exhaust and power down the battery power supply suddenly, the output level of the speech is effectively inhibited from being attenuated. Accordingly, a continuation operation can be protected and so can be the power supply.

According to the speech output control device according to the third embodiment, the synthesized speech of text data to be output as speech is generated as PCM data, while the peak value of PCM data for each frame (63 ms) is computed, and different ATT values (attenuation ratios) are set in accordance with the threshold values PCM1 to PCM10 corresponding to the PCM peak value. As the PCM peak value increases, the PCM data is attenuated by a larger attenuation ratio to cause the output level to fall within the limit of amplification and output speech at the raised minimum output level. When the PCM data of each frame (63 ms) is output, the voltage of the battery power supply B is detected, and one of the ATT value setting tables with attenuation characteristics A to D is selected to set an ATT value (attenuation ratio) corresponding to the PCM peak value. As the power supply voltage decreases more greatly, the PCM data is attenuated by a larger attenuation ratio to reduce the load to the battery power supply B. While the battery power supply B is increased in lifetime, not only text speech can be output such that it is easily heard at an adequate volume level without distorting any intoned speech part of the text speech or causing power-down due to an instantaneous increase in power load, but also its less-toned part can be amplified to such a high volume level that it is easy to hear.

In the speech output control device according to the third embodiment as well as those according to the first and second embodiments, the ATT value computing unit 22 computes an ATT value of PCM data for each frame and the ATT setting unit 23 sets the ATT value in the digital attenuator 24. Thus, the PCM data that is DMA-transferred to the digital attenuator 24 is adjusted to a volume level corresponding to the ATT value. With reference to step C29a in the flowchart shown in FIG. 25 and FIGS. 15A to 15C, when one-frame PCM data and an ATT value corresponding to the power supply voltage V and the PCM peak value are transferred from the ATT value computing unit 22 to the buffer memory (BUF1/BUF2) 12c6 in the RAM 12c, the volume of the PCM data itself is increased or decreased step by step from the ATT value for the preceding one-frame PCM data to that for the present one-frame PCM data. In this case, the digital attenuator 24 or the ATT setting unit 23 need not be required.

Since the digital attenuator 24 or the ATT setting unit 23 need not be required as described above, one-frame PCM data that is attenuated and transferred to the buffer memory (BUF1/BUF2) 12c6 can be transferred directly to the DAC 25 and output as speech. The minimum volume level can be raised with the maximum volume level falling with the limit of amplification not to cause power-down, thereby making the synthesized reading speech of text data easy to hear. Moreover, the ATT value of the ATT process performed when one-frame PCM data is output as speech can be increased or decreased continuously to output text speech not discontinuously but naturally.

In the speech output control device according to the third embodiment, the following operations can be carried out when one of the ATT setting tables with attenuation characteristics A to D is selected in accordance with the detected power supply voltage V. As in the hysteresis process A (FIGS. 18A to 20) in the second embodiment, a voltage threshold level for selecting one of the ATT setting tables according to whether the presently detected power supply voltage is lower than the last detected power supply voltage is switched between normal voltage threshold levels Level1 to Level4 and voltage threshold levels Level1' (=Level1+ΔV1) to Level4' (=Level4+ΔV4) which are each obtained by increasing its corresponding normal voltage threshold level by fixed voltage ΔV. As in the hysteresis process B (FIGS. 21 and 22) in the second embodiment, each of the ATT setting tables with attenuation characteristics A to D to be selected according to whether the presently detected power supply voltage is lower than the last detected power supply voltage is switched between an ATT setting table with a corresponding one of attenuation characteristics A (X) to D (X) having a larger amount of attenuation and an ATT setting table with a corresponding one of attenuation characteristics A (Y) to D (Y) having a smaller amount of attenuation. In both of the above two cases, the same advantages as those of the second embodiment can be obtained.

In the speech output control device according to the third embodiment, the following operations can be carried out when an ATT value corresponding to the PCM peak value is set in accordance with one of the ATT setting tables with attenuation characteristics A to D which is selected in accordance with the detected power supply voltage. As in the hysteresis process A (FIGS. 10A to 12) in the first embodiment, a PCM threshold value for setting the ATT value according to whether the present PCM peak value is not smaller than the last PCM peak value is switched between normal PCM threshold values PCM1 to PCM10 and PCM threshold values PCM1' (=PCM1−ΔP1) to PCM10' (=PCM10−ΔP10) which are each obtained by decreasing its corresponding normal PCM threshold value by fixed volume level ΔP. As in the hysteresis process B (FIGS. 13 and 14) in the first embodiment, each of the ATT setting tables with attenuation characteristics A to D to be selected according to whether the present PCM peak value is not smaller than the last PCM peak value is switched between an ATT setting table with characteristic X having a larger amount of attenuation and an ATT setting table with attenuation characteristic Y having a smaller amount of attenuation. In both of the above two cases, the same advantages as those of the second embodiment can be obtained.

In the speech output control device according to the third embodiment, one of ATT setting tables with different attenuation characteristics is selected in accordance with a drop in power supply voltage. Based on the selected ATT setting table, an ATT value (attenuation ratio) is set in accordance with the PCM peak value of PCM data in one frame. The minimum volume level of text speech can thus be raised while a battery power supply is inhibited from being powered down and its lifetime is increased. The text speech can be output at a volume level that makes the speech easy to hear for a long period of time if the battery power supply has only to be replaced one time.

The respective processes of the speech output control devices according to the first to third embodiments, namely, the dictionary search speech output process in the flowchart shown in FIG. 7, the speech output control process in the flowchart shown in FIG. 9, the hysteresis process A in the flowchart shown in FIG. 11, the hysteresis process B in the flowchart shown in FIG. 14, the speech output control process in the flowchart shown in FIG. 17, the hysteresis process A in the flowchart shown in FIG. 19, the hysteresis process B in the flowchart shown in FIG. 22, and the speech output control process in the flowcharts shown in FIGS. 24 and 25, can be all stored in the memory card (ROM card, RAM card, etc.) 13, a magnetic disk (floppy disk, hard disk, etc.), an optical disk (CD-ROM, DVD, etc.), and an external storage medium such as a semiconductor memory, as programs that can be executed by computers. Various computer terminals having a database (12b) of text data such as a dictionary read the programs stored in the external storage medium (13) into the program ROM 12a. The programs control the operations of the devices to fulfill the dictionary search function and the speech output control function in each of the embodiments and perform the above processes of the embodiments.

Program data for performing the above processes can be transferred on a communication network (Internet) N as a form of a program code. Further, the program data can be captured from a computer terminal (program server) connected to the communication network (Internet) N to fulfill the dictionary search function and the speech output control function described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A speech output control device which controls output of a series of speech data items, comprising:
    speech output means for outputting speech;
    power supply means for supplying a power supply voltage to output the speech from the speech output means;
    speech data acquisition means for acquiring speech data of one output unit from the series of speech data items;
    voltage detection means for detecting the power supply voltage supplied from the power supply means when the speech data of one output unit acquired by the speech data acquisition means is output;
    volume level adjustment means for adjusting a volume level of the speech data of one output unit acquired by the speech data acquisition means, in accordance with the power supply voltage detected by the voltage detection means; and
    speech output control means for causing the speech output means to output the speech data whose volume level is adjusted by the volume level adjustment means;
    wherein the volume level adjustment means includes attenuation value setting means for setting a volume attenuation value which increases with a decrease in the power supply voltage detected by the voltage detection means,
    wherein the volume level adjustment means attenuates and adjusts the volume level of the speech data of one output unit acquired by the speech data acquisition means, in accordance with the volume attenuation value set by the attenuation value setting means,
    wherein the speech output control device further comprises detected voltage comparison means for comparing a last power supply voltage last detected by the voltage detection means when the speech data of one output unit is output and a present power supply voltage presently detected by the voltage detection means when the speech data of one output unit is output, and
    wherein the attenuation value setting means sets a volume attenuation value that varies between a case where the present power supply voltage is lower than the last power supply voltage and a case where the present power supply voltage is higher than the last power supply voltage.

2. A speech output control device which controls output of a series of speech data items, comprising:
    speech output means for outputting speech;
    power supply means for supplying a power supply voltage to output the speech from the speech output means;
    speech data acquisition means for acquiring speech data of one output unit from the series of speech data items;
    voltage detection means for detecting the power supply voltage supplied from the power supply means when the speech data of one output unit acquired by the speech data acquisition means is output;
    volume level adjustment means for adjusting a volume level of the speech data of one output unit acquired by the speech data acquisition means, in accordance with the power supply voltage detected by the voltage detection means;
    speech output control means for causing the speech output means to output the speech data whose volume level is adjusted by the volume level adjustment means; and
    volume level acquisition means for acquiring a maximum volume level of the speech data of one output unit acquired by the speech data acquisition means;
    wherein the volume level adjustment means adjusts a volume level of the speech data of one output unit acquired by the speech data acquisition means, in accordance with the power supply voltage detected by the voltage detection means and the maximum volume level acquired by the volume level acquisition means, wherein the volume level adjustment means includes:
attenuation characteristic selection means for selecting one of different volume attenuation characteristics in accordance with the power supply voltage detected by the voltage detection means; and
attenuation value setting means for setting a volume attenuation value corresponding to the maximum volume level acquired by the volume level acquisition means in accordance with the volume attenuation characteristic selected by the attenuation characteristic selection means,
wherein the volume level adjustment means attenuates and adjusts the volume level of the speech data of one output unit acquired by the speech data acquisition means, in accordance with the volume attenuation value set by the attenuation value setting means,
wherein the speech output control device further comprises volume level comparison means for comparing a last maximum volume level of the speech data of one output unit, which is last acquired by the volume level acquisition means and a present maximum volume level of the speech data of one output unit, which is presently acquired by the volume level acquisition means, and
wherein the attenuation value setting means sets a volume attenuation value that varies between a case where the present maximum volume level is higher than the last maximum volume level and a case where the present maximum volume level is higher than the last maximum volume level.

3. The speech output control device according to claim 2, further comprising detected voltage comparison means for comparing a last power supply voltage last detected by the voltage detection means when the speech data of one output unit is output and a present power supply voltage presently detected by the voltage detection means when the speech data of one output unit is output, and
wherein the attenuation characteristic selection means selects a volume attenuation characteristic that varies in a total amount of attenuation between a case where the present power supply voltage is lower than the last power supply voltage and a case where the present power supply voltage is higher than the last power supply voltage.

4. A recording medium having recorded thereon a computer-readable speech output control program for controlling output of a series of speech data items under control of a computer of an electronic apparatus having a speech output unit and a power supply unit that supplies a power supply voltage to the speech output unit, wherein the program controls the computer to function as:
speech data acquisition means for acquiring speech data of one output unit from the series of speech data items;
voltage detection means for detecting the power supply voltage supplied from the power supply unit when the speech data of one output unit acquired by the speech data acquisition means is output;
volume level adjustment means for adjusting a volume level of the speech data of one output unit acquired by the speech data acquisition means, in accordance with the power supply voltage detected by the voltage detection means; and
speech output control means for causing the speech output unit to output the speech data whose volume level is adjusted by the volume level adjustment means;
wherein the volume level adjustment means includes attenuation value setting means for setting a volume attenuation value which increases with a decrease in the power supply voltage detected by the voltage detection means,
wherein the volume level adjustment means attenuates and adjusts the volume level of the speech data of one output unit acquired by the speech data acquisition means, in accordance with the volume attenuation value set by the attenuation value setting means,
wherein the program further controls the computer to function as detected voltage comparison means for comparing a last power supply voltage last detected by the voltage detection means when the speech data of one output unit is output and a present power supply voltage presently detected by the voltage detection means when the speech data of one output unit is output, and
wherein the attenuation value setting means sets a volume attenuation value that varies between a case where the present power supply voltage is lower than the last power supply voltage and a case where the present power supply voltage is higher than the last power supply voltage.

* * * * *